(12) United States Patent
Ogata et al.

(10) Patent No.: US 9,506,632 B2
(45) Date of Patent: Nov. 29, 2016

(54) LIGHT-EMITTING MODULE, AND ILLUMINATION LIGHT SOURCE AND ILLUMINATION DEVICE USING SAME

(71) Applicant: PANASONIC CORPORATION, Osaka (JP)

(72) Inventors: Toshifumi Ogata, Osaka (JP); Atsuyoshi Ishimori, Osaka (JP); Masumi Abe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/359,406

(22) PCT Filed: Oct. 16, 2012

(86) PCT No.: PCT/JP2012/006609
§ 371 (c)(1),
(2) Date: May 20, 2014

(87) PCT Pub. No.: WO2013/088619
PCT Pub. Date: Jun. 20, 2013

(65) Prior Publication Data
US 2015/0049480 A1  Feb. 19, 2015

(30) Foreign Application Priority Data

Dec. 16, 2011  (JP) ................. 2011-276372
Apr. 26, 2012  (JP) ................. 2012-101151

(51) Int. Cl.
*F21V 19/00* (2006.01)
*F21K 99/00* (2016.01)
(Continued)

(52) U.S. Cl.
CPC ............... *F21V 19/002* (2013.01); *F21K 9/00* (2013.01); *H01L 25/0753* (2013.01);
(Continued)

(58) Field of Classification Search
CPC ........... H01L 2924/00; H01L 25/0753; H01L 33/505; H01L 2224/48091; H01L 2224/48137; F21K 9/00; F21K 9/13; F21V 19/002
See application file for complete search history.

(56) References Cited

U.S. PATENT DOCUMENTS 4,298,869 A * 11/1981 Okuno ................. G08B 5/36
257/88
5,222,806 A * 6/1993 Roberts, III ............ F21V 21/26
248/122.1
(Continued)

FOREIGN PATENT DOCUMENTS

CN         2348246 Y    11/1999
CN        101312185 A   11/2008
(Continued)

OTHER PUBLICATIONS

International Search Report and Written Opinion of the International Searching Authority with English language translation of International Search Report from PCT/JP2012/006609, mail date is Dec. 25, 2012.
(Continued)

*Primary Examiner* — Sharon Payne
(74) *Attorney, Agent, or Firm* — Greenblum & Bernstein, P.L.C.

(57) ABSTRACT

A light-emitting module includes a substrate, and elongated light-emitting units arranged in rows on the substrate. Each light-emitting unit includes an element array of light-emitting elements arranged on the substrate and a sealing member sealing the element array. The sealing member contains a wavelength converting material. When the light-emitting units are viewed from a direction that is parallel to a surface on which the plurality of light-emitting units are arranged and coincides with a row direction being a direction along which the light-emitting units are arranged in rows, two of the light-emitting units are arranged such that portions of one of the two light-emitting units nearer to the center in the row direction are visible without being obstructed by the other light-emitting unit.

19 Claims, 21 Drawing Sheets

(51) Int. Cl.
  *H01L 33/50*  (2010.01)
  *F21K 9/232*  (2016.01)
  *H01L 25/075*  (2006.01)
  *F21S 8/02*  (2006.01)

(52) U.S. Cl.
  CPC ............... *F21K 9/232* (2016.08); *F21S 8/026* (2013.01); *F21Y 2107/50* (2016.08); *F21Y 2115/10* (2016.08); *H01L 33/505* (2013.01); *H01L 2224/45144* (2013.01); *H01L 2224/48091* (2013.01); *H01L 2224/48137* (2013.01); *H01L 2924/181* (2013.01)

(56) References Cited

U.S. PATENT DOCUMENTS

| | | | | |
|---|---|---|---|---|
| 6,452,217 | B1* | 9/2002 | Wojnarowski et al. | 257/99 |
| 7,872,418 | B2 | 1/2011 | Hata et al. | |
| 7,918,575 | B2* | 4/2011 | Ho | F21K 9/00 313/500 |
| 8,215,802 | B2* | 7/2012 | Bailey | F21K 9/52 362/311.02 |
| 8,573,800 | B2 | 11/2013 | Urano | |
| 2008/0128739 | A1 | 6/2008 | Sanpei et al. | |
| 2008/0231169 | A1 | 9/2008 | Hata et al. | |
| 2010/0188852 | A1 | 7/2010 | Sanpei et al. | |
| 2011/0180817 | A1* | 7/2011 | Ishizaki | F21K 9/135 257/88 |
| 2011/0182073 | A1 | 7/2011 | Sanpei et al. | |
| 2011/0303927 | A1 | 12/2011 | Sanpei et al. | |
| 2012/0044669 | A1 | 2/2012 | Ogata et al. | |
| 2012/0201028 | A1 | 8/2012 | Sanpei et al. | |
| 2014/0009924 | A1 | 1/2014 | Kotera et al. | |
| 2014/0177217 | A1 | 6/2014 | Ogata et al. | |

FOREIGN PATENT DOCUMENTS

| | | |
|---|---|---|
| CN | 201206808 Y | 3/2009 |
| CN | 201368384 Y | 12/2009 |
| CN | 101706049 A | 5/2010 |
| CN | 201526842 U | 7/2010 |
| CN | 201731331 U | 2/2011 |
| CN | 201779609 U | 3/2011 |
| JP | 2008-235824 | 10/2008 |
| JP | 2008-244165 | 10/2008 |
| JP | 2010-251796 | 11/2010 |
| WO | 2010/098457 A1 | 9/2010 |
| WO | 2011/111399 | 9/2011 |

OTHER PUBLICATIONS

Chinese Office Action in CN201280040229.7, with English language search report, mailed Feb. 13, 2015.

* cited by examiner

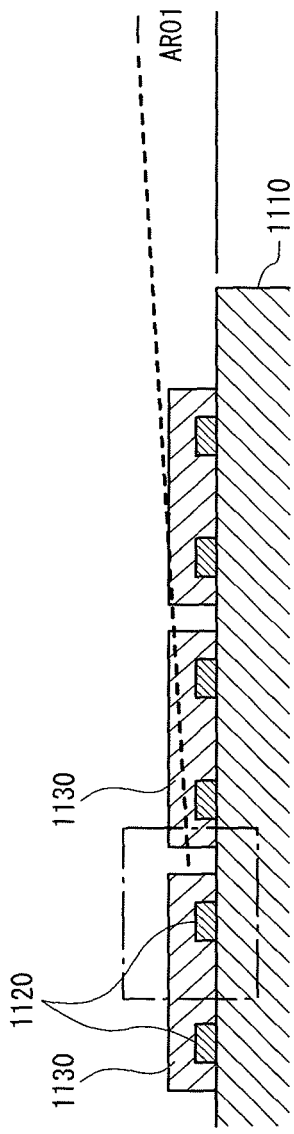
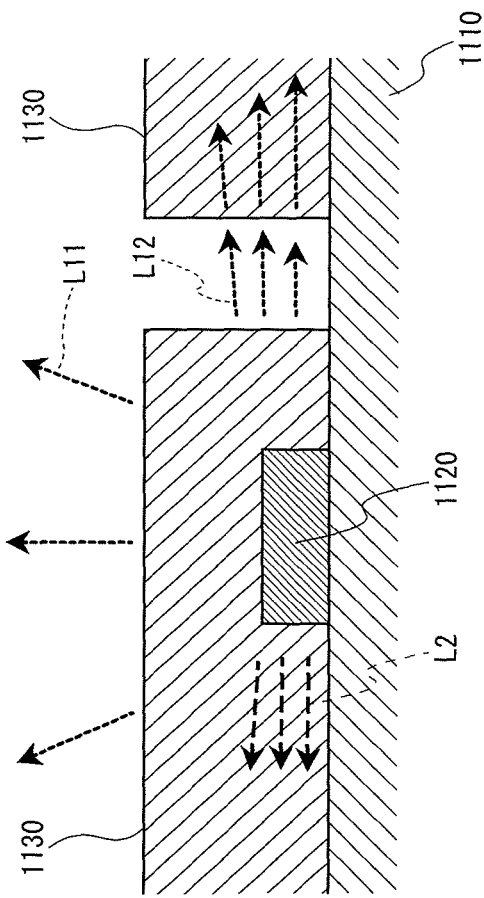
FIG. 21A Prior Art
FIG. 21B Prior Art

LIGHT-EMITTING MODULE, AND ILLUMINATION LIGHT SOURCE AND ILLUMINATION DEVICE USING SAME

TECHNICAL FIELD

The present invention relates to a light-emitting module having light-emitting elements such as light-emitting diodes (LEDs), and to a lighting source and lighting device including the light-emitting module.

DESCRIPTION OF THE RELATED ART

In recent years, there has been a growing demand for conservation of resources in the field of lighting sources such as halogen light bulbs and fluorescent lamps, and active developments have been carried out on light-emitting modules including LEDs to enhance the power-saving capabilities and product life cycle thereof. In such light-emitting modules, shortage of luminance in the individual LED is supplemented by high integration of the LEDs.

FIG. 20 illustrates a light-emitting module 1100 which has been proposed as one example of a light-emitting module as mentioned above. The light-emitting module 1100 includes a substrate 1110, a plurality of LEDs 1120 which are arranged in 12 element arrays on the substrate, and sealing members 1130 each sealing two element arrays (refer to Patent Literature 1 below).

The LEDs 1120 are blue LEDs each emitting blue light. The sealing members 1130 are each made of a silicone resin containing yellow phosphor. The LEDs 1120 emit light in all directions. The sealing members 1130 converts a portion of the light emitted from the LEDs 1120 to yellow light. Blue light emitted from the LED 1120 and yellow light converted by the sealing members 1130 are mixed to produce white light.

CITATION LIST

Patent Literature

[Patent Literature 1]
Japanese Patent Application Publication No. 2008-244165

SUMMARY

Technical Problem

FIG. 21A is a partial cross-sectional view along the line B-B in FIG. 20.

In the light-emitting module 1100 illustrated in FIG. 20, each sealing member 1130 seals two arrays. Therefore, the following is noted with respect to light emitted from the individual LEDs 1120 in directions substantially parallel to a surface of the substrate 1110 having the LEDs 1120 arranged thereon and perpendicular to a direction along which the elements are arranged (i.e., an array direction). Out of the light, the portion emitted in a first direction towards the other element array that is sealed by the same sealing member 1130 (as indicated by the arrows L2 in FIG. 21B) travels a longer distance in the propagation path thereof before reaching the outer circumference surface of the sealing member 1130 sealing the individual LED 1120. Accordingly, a larger percentage of the portion emitted in the first direction is converted to yellow light, which is mixed with blue light to produce yellowish light rather than white light.

In contrast, the following is noted with respect to (i) light emitted from the individual LED 1120 toward a region above the substrate 1110 (as indicated by the arrows L11 in FIG. 21B) and (ii) light emitted in a second direction, which is a direction opposite to the first direction and thus substantially parallel to a surface of the substrate 1110 having the LEDs 1120 arranged thereon and perpendicular to the array direction (as indicated by the arrows L12 in FIG. 21B). Those light portions (i) and (ii) travel an adequate distance in the propagation path from the individual LED 1120 before reaching the outer circumference surface of the sealing member 1130. Accordingly, an adequate percentage of these portions of light is converted to yellowish light, which serves to produce light of a color closer to white.

However, the portion emitted in the second direction (indicated as the arrows L12 in FIG. 21B) then enters the adjacent sealing member 1130 and propagates therein. Consequently, the portion is further converted to more yellowish light from white light.

Accordingly, light emitted from the light-emitting module 1100 in the direction which is substantially parallel to the surface of the substrate 1110 having LEDs 1120 arranged thereon and perpendicular to the element arrays is converted to produce yellowish light rather than white light. This causes unevenness in the color of the light emitted by the light-emitting module. An example of the above-mentioned light is shown in FIG. 21A as the light irradiating a region AR01 positioned on one side of the light-emitting module 1100, which is hereinafter referred to as "light emitted in the side direction of the light-emitting module 1100."

In view of the above problem, the present invention aims to provide a light-emitting module including a plurality of light-emitting elements, lighting source, and lighting device, which produces light while suppressing unevenness in the color of the light.

Solution to Problem

To achieve the above aims, one aspect of the present invention is a light-emitting module, comprising: a substrate; and a plurality of elongated light-emitting units that are arranged in rows on the substrate, wherein each light-emitting unit includes an element array of a plurality of light-emitting elements arranged on the substrate and a sealing member sealing the element array, the sealing member containing a wavelength converting material, one light-emitting unit of the light-emitting units that is nearer to the center of the substrate in a row direction is longer in a longitudinal direction of the one light-emitting unit than another light-emitting unit of the light-emitting units that is nearer to an edge of the substrate in the row direction, the row direction being a direction along which the plurality of light-emitting units are arranged in rows, when the light-emitting units are viewed from a direction that is parallel to a surface on which the plurality of light-emitting units are arranged and that coincides with the row direction, two of the light-emitting units are arranged such that both end portions of one of the two light-emitting units that is nearer to the center in the row direction are visible without being obstructed by the other light-emitting unit, and each of the visible end portions contains at least one of the light-emitting elements in the corresponding element array.

Preferably, an imaginary envelope line through edges of the plurality of light-emitting units in a longitudinal direction thereof defines an arc.

Preferably, the plurality of light-emitting elements are divided into K groups, each group including N light-emitting elements, where N and K are each an integer not less than 1, the substrate has a wiring pattern formed thereon that connects the K groups in parallel and connects the N light-emitting elements included in each group in series, and the number of light-emitting elements included in any element array longer in the longitudinal direction thereof is larger than the number of light-emitting elements included in any element array shorter in the longitudinal direction thereof.

Preferably, at least two pairs of adjacent light-emitting units among the light-emitting units are each arranged such that one of the adjacent light-emitting units in the pair which is nearer to the center of the substrate has the visible end portions which are visible without being obstructed by the other light-emitting unit in the pair, and the visible end portions of the light-emitting unit in the one of the two pairs which is nearer to the center of the substrate are shorter in length than the visible end portions of the light-emitting unit in the other of the two pairs which is nearer to the edge of the substrate.

Preferably, in a plan view of the substrate, a center axis of the sealing member of each light-emitting unit in the longitudinal direction thereof matches an axis passing through centers of the light-emitting elements included in the light-emitting unit.

Preferably, centers of the light-emitting units in the longitudinal direction thereof are all aligned in the row direction.

Preferably, at least two adjacent light-emitting units are arranged such that light-emitting elements included in one of the light-emitting units are out of alignment with light-emitting elements included in the other one of the light-emitting units when viewed in the direction perpendicular to the array direction of the element arrays.

Preferably, both ends of the sealing member of each light-emitting unit in an array direction, along which the light-emitting elements included therein are arranged, are in a rounded shape.

Preferably, the protection devices are arranged outside an area of the substrate in which the plurality of light-emitting units are arranged.

Preferably, the sealing members each contain a resin material having light transmitting properties.

Another aspect of the present invention is a lighting source comprising the above light-emitting module.

A yet another aspect of the present invention is a lighting device comprising the above lighting source.

Advantageous Effects of Invention

According to the above-described structure of the light-emitting module including the plurality of light-emitting units arranged on the substrate, when the light-emitting units are viewed from a direction that is parallel to a surface on which the plurality of light-emitting units are arranged and coincides with a row direction being a direction along which the light-emitting units are arranged in rows, two of the light-emitting units are arranged such that portions of one of the two light-emitting units nearer to the center in the row direction are visible without being obstructed by the other light-emitting unit. With this structure, white light emitted from portions of light-emitting units radiates the outside without entering the adjacent light-emitting units. Therefore, the white light emitted from the portions of the light-emitting unit is less effected by wavelength converting material contained in the sealing member of the adjacent light-emitting unit. This suppresses unevenness in the color.

BRIEF DESCRIPTION OF DRAWINGS

FIGS. 21A and 21B illustrate optical properties of the conventional light-emitting module.

DESCRIPTION OF EMBODIMENTS

First Embodiment (1) Structure

Figure 1:
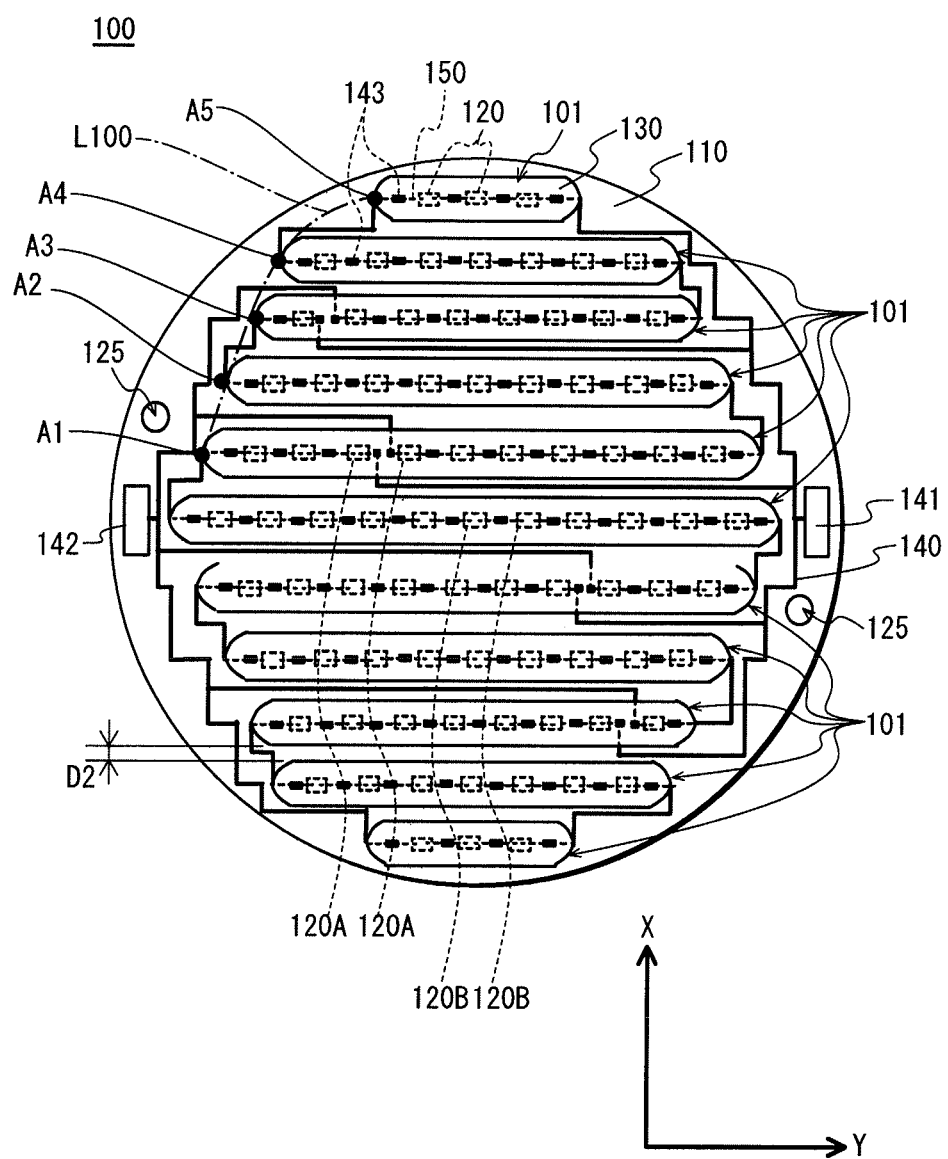
FIG. 1 is a plan view showing a light-emitting module pertaining to First Embodiment.

FIG. 1 shows a light-emitting module 100 pertaining to First Embodiment. The light-emitting module 100 includes a substrate 110, and 11 light-emitting units 101 having an elongated shape and arranged in parallel on the substrate 110 in the X axis direction. The light-emitting units 101 are each constituted by an element array including a plurality of LEDs (semiconductor light-emitting element) 120 and a sealing member 130 sealing all the LEDs 120 included in the element array.

(1-1) Substrate

The substrate 110 has a substantially circular shape when viewed from a direction perpendicular to a surface on which the LEDs are arranged (hereinafter referred to as "in a plan view"). The substrate 110 comprises a plate made of metal such as aluminum, and an insulation film formed on the surface of the plate and made of a heat-conductive resin such as polycarbonate. The substrate 110 also has a wiring pattern 140 on the surface thereof. The wiring pattern 140 is made of metal such as Ag and Cu. The insulation film may be made of ceramics, for example.

The shape of the substrate 110 is not limited to a specific one. Any shape formed by a combination of lines and curves may be selected appropriately, depending on the purpose and the like. For example, a polygon such as a tetragon and hexagon is acceptable. An elliptical shape also falls within a scope of the embodiments of the present invention. It is preferable that the substrate 110 is made of ceramics or heat-conductive resin for improving heat dissipation. The substrate 110 may be either single-layer structured or multi-layer structured. By using a substrate including a ceramic substrate made of alumina and the like and a wiring pattern formed directly on the surface thereof, the resulting light-emitting module will have an excellent quality. This is because heat generated by LEDs during lighting is easily conducted to the ceramic substrate having excellent heat dissipation properties.

The wiring pattern 140 includes a pair of lands 141 and 142 for supplying power and a plurality of lands 143 for electrically connecting LEDs 120.

The method for forming the wiring pattern 140 is not limited to a specific one. Well-known pattern-forming methods such as printing and plating are acceptable.

The lands 141 and 142 are formed in respective regions in the periphery of the substrate 110, the regions being positioned on a virtual axis extending in parallel to the longitudinal direction (the Y-axis direction) of the light-emitting units 101 to pass through the center of the substrate 110. The lands 143 are each in correspondence with the LED 120 arranged on the substrate 110 (i.e., between each two adjacent LEDs 120).

In addition, the substrate 110 has through holes 125 in the vicinity of the lands 141 and 142 for insertion of lead wires from a power supply unit, for example.

(1-2) LED

Each LED 120 is a GaN-based LED that emits blue light, and has a substantially rectangle shape in a plan view. Each LED 120 is fixed to the substrate 110 such that the surface on which electrodes are formed faces away from the substrate 110 (so-called "face-up mounting").

The substrate 110 has 85 LEDs 120 arranged thereon. A wiring pattern 140 connects, in parallel, five series circuits each including 17 LEDs 120 connected in series. Accordingly, the same voltage is applied to each of the 85 LEDs 120, which achieves uniformity in luminance of the LEDs 120. Note that, the manner of connecting the LEDs 120 by the wiring pattern 140 is not limited to the specific one described above. For example, the wiring pattern 140 may be formed to connect, in parallel, 17 series circuits each including five LEDs 120 connected in series.

The substrate 110 has 11 element arrays arranged thereon along the X-axis direction, each element array being an array of light-emitting elements (LEDs) and including 3 to 11 LEDs 120. More specifically, the central element array which is the one positioned to pass through the center of the substrate 110 includes 11 LEDs 120. Two element arrays franking the central element array in the X-axis direction (i.e., the direction which is perpendicular to the array direction of the element arrays) includes 10 LEDs 120. Each element array directly adjacent to any element arrays that include 10 LEDs 120 on the one side away from the center of the substrate 110 includes 9 LEDs 120. Each element array directly adjacent to any element arrays that include 9 LEDs 120 on the one side away from the center of the substrate 110 includes 8 LEDs 120. Each element array directly adjacent to any element arrays that include 8 LEDs 120 on the one side away from the center of the substrate 110 includes 7 LEDs 120. The element array at each edge of the substrate 110 in the X-axis direction (i.e., the direction perpendicular to the array direction of the element arrays) includes three LEDs 120. The element arrays that include three LEDs 120 are nearest to the outer periphery of the substrate 110 among the 11 element arrays. In other words, the element arrays are arranged to conform to the shape of the substrate 110. The above-described arrangement achieves a high area occupation ratio of the region having the LEDs 120 arranged therein to the surface of the substrate 110. This improves luminance of the light-emitting module 100.

Each two element arrays adjacent to each other in a direction perpendicular to the array direction of the element arrays are arranged such that LEDs 120A included in one of the two adjacent element arrays are positioned to be out of alignment with LEDs 120B included in the other of the two adjacent element arrays in the direction perpendicular to the array direction of the element arrays.

The above-described arrangement allows the distance between any LED 120A included in one of the two adjacent element arrays and the corresponding LED 120B included in the other of the two adjacent element arrays to be longer when compared with an arrangement in which any LED 120A included in one of the two adjacent element arrays and the corresponding LED 120B included in the other of the two adjacent element arrays are aligned in the direction perpendicular to the array direction of the element arrays.

Accordingly, the LED 120B included in the other one of the two element arrays may block off less portion of the light emitted from the LED 120A included in the one of the two element arrays. This improves light-extraction efficiency.

In addition, since the longer distance between the LED 120A included in the one of the two adjacent element arrays and the LED 120B included in the other one of the two adjacent element arrays, the heat generated by LEDs 120 is more easily dissipated from the surface of the substrate 110. This improves heat dissipation.

It is preferable that each two element arrays adjacent to each other in the direction perpendicular to the array direction of the element arrays are arranged such that LEDs 120A included in one of the two element arrays are positioned out of alignment with LEDs 120B included in the other of the two element arrays in the direction perpendicular to the array direction of the element arrays.

Figure 2A:
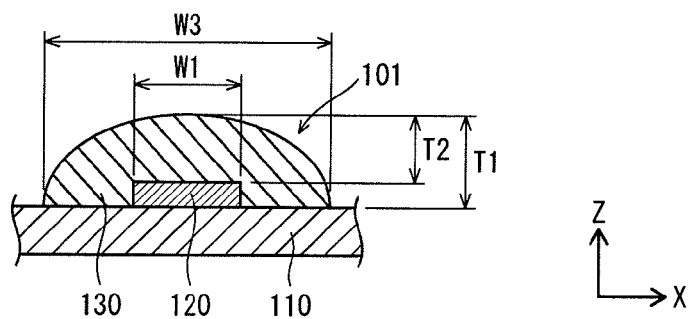
FIG. 2A is a partial cross-sectional view showing the light-emitting module pertaining to First Embodiment.
Figure 2B:
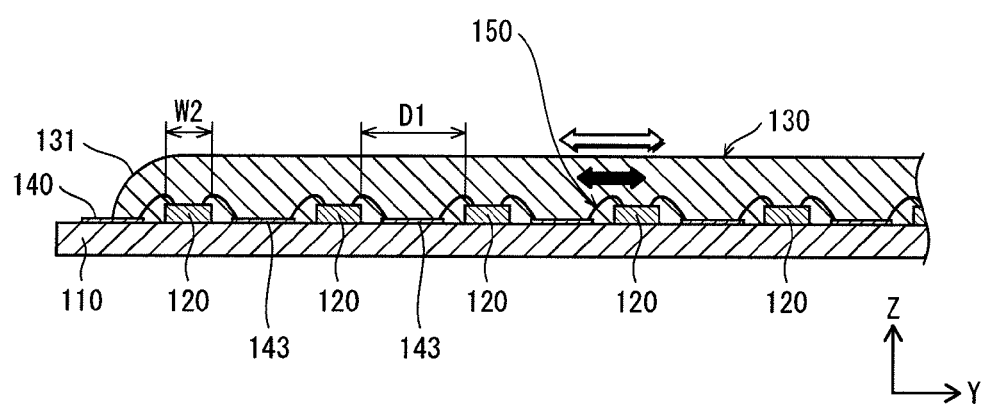
FIG. 2B is another partial cross-sectional view showing the light-emitting module pertaining to First Embodiment.

FIGS. 2A and 2B are partial cross-sectional views showing the light-emitting module 100. FIG. 2A is the cross-sectional view in the short-length direction of the light-emitting unit 101. FIG. 2B is the cross-sectional view in the longitudinal direction of the light-emitting unit 101.

As shown in FIG. 2B, each LED 120 is electrically connected to lands 143 via wires 150 made of metal such as gold. Each wire has two ends, one being connected to the LED 120 and the other being connected to the land 143. In other words, the LEDs 120 are electrically connected, via the wires 150, to the wiring pattern 140 formed on the substrate 110. The substrate 110 also has wire pads (not shown) formed on the surface thereof on which the wires 150 are provided.

As shown in FIG. 1 and FIG. 2B, each wire 150 is arranged along the array direction of the element arrays (along the Y-axis direction), and the both ends of the wire are also arranged along the array direction. Due to this arrangement, when each sealing member 130 expands or contracts in the array direction of the corresponding element array (i.e., in the direction indicated by a white arrow in FIG. 2B), the wires included therein are subject to stress only along the array direction of the element array (i.e., in the direction indicated by a black arrow in FIG. 2B). In other words, the wire 150 is not subject to stress in the direction perpendicular to the element arrays. Accordingly, the wire is prevented from being twisted due to the expansion and contraction of the sealing member 130. In addition, the wires 150 are sealed by the sealing member 130 together with the LEDs 120 and lands 143. Accordingly, the wires 150 are prevented from being deteriorated, and insulation of the wires from the outside is maintained.

In addition, the above-described arrangement in which the plurality of LEDs 120 are electrically connected to the wiring pattern 140 via wires 150 and lands 143 requires less amount of material for forming the wiring pattern when compared with an arrangement in which a wiring pattern is formed in a linear arrangement. This is advantageous in view of material cost. Furthermore, the reduction in the amount of material for forming the wiring pattern results in the suppression of the deterioration of light-extraction efficiency. This is because the wiring pattern made up of metal wires such as gold wires generally absorbs light.

In First Embodiment described above, the LEDs 120 and the wires 150 are arranged alternately and contiguously with the wire pads therebetween. The present invention is not limited to this arrangement. For example, only LEDs may be arranged repeatedly.

As shown in FIGS. 2A and 2B, each LED 120 has a width W1 of 0.3 mm to 1.0 mm in the short-length direction thereof (i.e., in the X-axis direction) in a plan view, and a width W2 of 0.3 mm to 1.0 mm in the longitudinal direction thereof (i.e., in the Y-axis direction) in a plan view. Each LED 120 has a thickness (i.e., a width in the Z-axis direction thereof) of 0.08 mm to 0.30 mm. Each LED 120 is arranged such that the maximum width direction thereof (i.e., the longitudinal direction thereof in a plan view) matches the array direction of the element array including the LED. According to this arrangement, each LED 120 has a smaller width in the row direction thereof. This reduces the width W3 of each sealing member 130 in the short-length direction (i.e., the X-axis direction) in a plan view. As a result of the reduction, the gap between two adjacent sealing members 130 widens, which reduces heat transferred between the two adjacent sealing members 130 through the substrate 110. This improves the heat dissipation properties of the sealing members 130.

It is preferable that the distance D1 between two adjacent LEDs 120 included in the same element array in the array direction of the element array (i.e., in the Y-axis direction) be in a range of 1.0 mm to 3.0 mm, as shown in FIG. 2B. This distance enables sufficient dissipation of heat generated by the LEDs 120 and suppression of unevenness in the luminance.

(1-3) Sealing Member

As shown in FIG. 1, each sealing member 130 is in an elongated shape, and seals an element array including a plurality of LEDs 120. The sealing members 130 are provided in one-to-one correspondence with the element arrays. Each sealing member 130 seals all of the plurality of LEDs 120 included in the corresponding element array. Accordingly, a plurality of sealing members 130 are arranged in the direction perpendicular to the array direction of the element arrays. The length in the longitudinal direction of any sealing member 130 is shorter than that of another sealing member positioned further from the edge of the substrate 110 in a direction along which the sealing members 130 are arranged in rows (i.e., a row direction of the sealing members 130). The sealing members 130 all have their centers in the longitudinal direction aligned in a direction along which the element arrays are arranged in rows (i.e., a row direction of the element arrays). When the 11 sealing members 130 are viewed from the direction which is parallel to the surface on which the LEDs 120 are arranged and perpendicular to the array direction of the element arrays (i.e., viewed from the row direction of the sealing members 130), six sealing members 130 are visible such that portions of any sealing member 130 are visible without being obstructed by the sealing member 130 that is positioned closer to the viewer.

Each sealing member 130 is made of a resin material having light transmitting properties and containing phosphors (i.e., a wavelength converting material). Examples of such resin materials include silicone resin, fluoro resin, silicone-epoxy hybrid resin, and urea resin. Powders of YAG phosphor (($Y, Gd)_3Al_5O_{12}:Ce^{3+}$), silicate phosphor (($Sr, Ba)_2SiO_4:Eu^{2+}$), nitride phosphor (($Ca, Sr, Ba)AlSiN_3$:$Eu^{2+}$), oxynitride phosphor ($Ba_3Si_6O_{12}N_2:Eu^{2+}$), and the like may be used as the phosphors. A portion of the blue light emitted from the LEDs 120 is converted to yellow-green light, and the color mixture produces white light. In each light-emitting unit 101, it is preferable that the central axis of the sealing member 130 along the longitudinal direction match the arrangement axis of the element array along which the light-emitting elements included therein are arranged. This is because unevenness in the color of the emitted light is suppressed when the central axis of the sealing member 130 and the arrangement axis of the element array match.

The distance D2 between two adjacent sealing members 130 in the row direction of the sealing members 130 (i.e., in the X-axis direction) is 1.0 mm. It is preferable that the distance D2 is in a range of 0.2 mm to 3.0 mm. This distance enables sufficient heat dissipation efficiency and suppression of unevenness in the luminance of the light-emitting module which occurs when the distance between element arrays is large.

As shown in FIG. 2A, each sealing member 130 has a substantially semi-elliptic shaped cross-section, and thus has rounded sides, along the short-length direction thereof. As shown in FIG. 2B, an end portion 131 of the sealing member 130 in the longitudinal direction is substantially quarter-circle shaped, and thus has a substantially semicircular shape in a plan view (see FIG. 1). The cross section of the end portion along the longitudinal direction is substantially circular with a central angle of approximately 90° (see FIG. 2B). Due to the above-described shape, stress hardly concentrates at the end portion 131 in the longitudinal direction of the sealing member 130, which allows a larger portion of light emitted by the LEDs 120 to exit the sealing member 130.

Each sealing member 130 has a width W3 of 0.8 mm to 3.0 mm in the short-length direction thereof (i.e., in the X-axis direction). The maximum thickness T1 (i.e., the width in the Z-axis direction) of the light-emitting unit 101 including the thickness of the LEDs 120 is in a range of 0.4 mm to 1.5 mm. The thickness T2 of the sealing member 130 obtained by subtracting the thickness of the LED 120 from the maximum thickness T1 is in a range of 0.2 mm to 1.3 mm. In order to secure reliability of sealing, the width W3 of each sealing member 130 is preferably two to seven times the width W1 of the LED 120. In consideration of the case in which a sealing member 130 deforms due to heat by expanding on both sides in the short-length direction (the X-axis direction), it is preferable that the thickness T2 be determined with a margin. More specifically, the thickness T1 may be ¼ to ⅔ times the width W3. The sealing members 130 of First Embodiment can be formed to have a rounded cross-section in both the longitudinal and short-length directions by using a dispense method, which is described below in more detail.

As described above, the light-emitting module 100 of the present invention includes the plurality of light-emitting units 101 that are arranged such that, when the plurality of sealing members are viewed in a direction which is parallel to the surface on which the LEDs 120 are arranged and perpendicular to the array direction of the element arrays, at least two of the light-emitting units 101 are in a positional relationship such that portions of one of the two light-emitting units 101 which is nearer to the center of the substrate are visible without being obstructed by the other of the two light-emitting unit 101. Accordingly, it is less likely that light emitted by any LED 120 enters the adjacent light-emitting unit 101 and converted to yellow light. This is especially true of the light emitted by the LEDs positioned in the end portions of the light-emitting unit 101. As a result, uniform white light is produced with reduced unevenness in the color.

Furthermore, since sealing members 130 are formed in one-to-one correspondence with element arrays each including a plurality of LEDs 120 arranged in a line, it is less probable that extreme and local increase in temperature occurs, when compared with, for example, an arrangement in which all the LEDs 120 are sealed by a single sealing member. This suppresses local reduction in the luminance of LEDs 120 and in the excitation efficiency of phosphors. Accordingly, unevenness in the luminance and color is suppressed.

Furthermore, with respect to the propagation path of the light emitted out of the sealing member 130 in the direction perpendicular to the array direction of the element arrays, the distance on the path from the outer circumference surface of an LED 120 to the outer circumference surface of a sealing member 130 sealing the LED 120 does not differ much depending on the direction in which the light is emitted. This small dependency suppresses unevenness in color of the light emitted out of the outer circumference surface of the sealing member 130 in the direction perpendicular to the element arrays.

In addition, due to gaps between sealing members 130, less amount of material is required for forming the sealing members 130. This reduction in the material cost results in the reduction in the total cost of the light-emitting module 100.

In the light-emitting module 100 of the present invention, the plurality of light-emitting units 101 included therein are arranged such that, at least two of the light-emitting units 101 are in a positional relationship such that at least a portion of one of the two light-emitting units 101 which is nearer to the center of the substrate are visible without being obstructed by the other of the two light-emitting unit 101. However, it is not required that every light-emitting unit 101 on the substrate 110 is positioned to have a portion that is visible without being obstructed by the directly adjacent light-emitting unit 101 positioned nearer to the edge. Some of the light-emitting units 101 may be positioned to have the ends thereof aligned with those of another light-emitting unit in the row direction of the light-emitting units 101.

In the light-emitting module 100 pertaining to First Embodiment, at least two pairs of adjacent light-emitting units are each in a positional relationship such that one of the adjacent light-emitting units in the pair which is nearer to the center of the substrate has at least one portion visible without being obstructed by the other light-emitting unit in the pair. The visible portion of the light-emitting unit in one of the two pairs which is nearer to the center of the substrate is shorter in length than the visible portion of the light-emitting unit in the other of the two pairs which is nearer to the edge of the substrate.

The centers of the light-emitting units 101 in the longitudinal direction thereof are aligned in the row direction of the light-emitting units 101.

In contrast, in an arrangement in which all the light-emitting units 101 have the same length in the longitudinal direction thereof, the light emitted from the light-emitting module 100 in the direction which is parallel to the surface of the substrate 110 and coincides with the row direction of the light-emitting units 101 enters between adjacent light-emitting units 101, which causes unevenness in the color. The unevenness in the color is distinguished in the vicinity of the center of the substrate 110 in the longitudinal direction of light-emitting units 101.

Accordingly, in order to effectively suppress the unevenness in the color of the light emitted by the light-emitting module 100, the following arrangement is preferable. That is, at least two pairs of adjacent light-emitting units are each in a positional relationship such that one of the adjacent light-emitting units in the pair which is nearer to the center of the substrate has at least one portion visible without being obstructed by the other light-emitting unit in the pair, and the visible portion of the light-emitting unit in the one of the two pairs which is nearer to the center of the substrate is shorter in length than the visible portion of the light-emitting unit in the other of the two pairs which is nearer to the edge of the substrate.

It is preferable that each light-emitting unit 101 has longer visible portions than the visible portions of the directly adjacent light-emitting units 101 positioned nearer to the center of the substrate in the row direction of the light-emitting units 101 (i.e., each light-emitting unit 101 has longer visible portions than the visible portions of the directly adjacent light-emitting units 101 positioned further from the edge of the substrate in the row direction of the light-emitting units 101).

A virtual line (also referred to as an "asymptotic line") L100 can be drawn by connecting intersections at which the centerline coinciding with the center axis of the light-emitting unit 101 intersects the edges thereof (i.e., by connecting the points A1 to A5 in FIG. 1, which are each referred to merely as an "edge of the light-emitting unit 101"). The shape defined by the virtual line L100 indicates the degree of unevenness in the color of the light emitted in the direction which is parallel to the surface of the substrate and coincides with the row direction of the light-emitting units 101. Accordingly, in First Embodiment, the shape defined by the virtual line is determined based on the unevenness in the color of the light emitted from the light-emitting module 100 in the direction which is parallel to the surface of the substrate 110 and coincides with the row direction of the light-emitting units 101 (i.e., the light emitted from the plurality of light-emitting units 101 in the direction which is parallel to the surface on which LEDs 120 are arranged and perpendicular to the array direction of the element arrays each including a plurality of LEDs 120).

Note that the shape of the virtual line is not limited to a specific one. The shape of the virtual line may be determined according to the shape of the substrate 110. The shape may be determined such that all the edges of the light-emitting units 101 define an arc.

(2) Luminescence Properties of Light-Emitting Module

With respect to light emitted from an LED 120 in the direction which is perpendicular to the array direction of the element arrays and parallel to the substrate 110, the number of the sealing members 130 on the propagation path of the light varies according to the position of the LED 120 emitting the light.

Figure 3A:
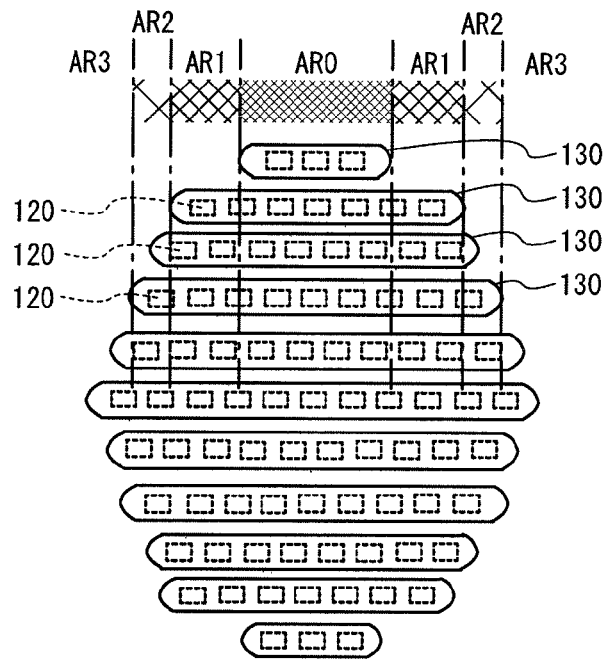
FIGS. 3A and 3B illustrate optical properties of the light-emitting module pertaining to First Embodiment.
Figure 3B:
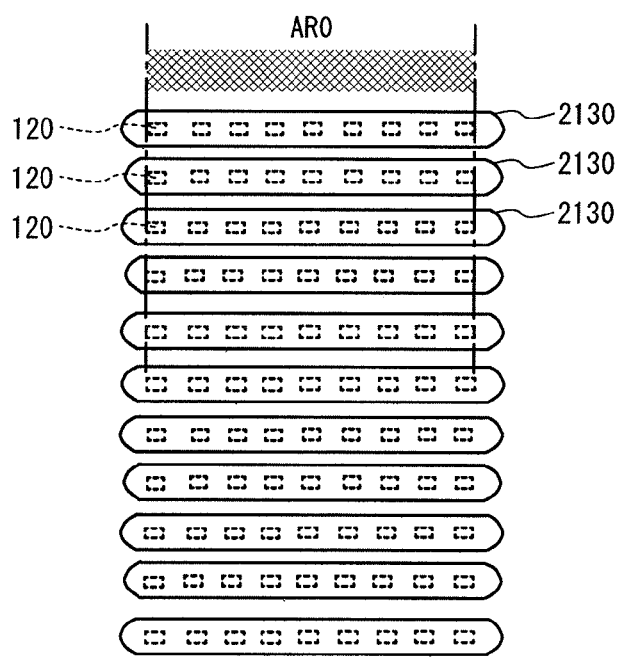

FIG. 3A illustrates the relationship between the arrangement of LEDs 120 and sealing members 130, and color characteristics (i.e., yellowness) of the light emitted laterally from the light-emitting module 100. FIG. 3B illustrates the relationship between the arrangement of LEDs 120 and sealing members 2130 in the light-emitting module pertaining to a comparative example and color characteristics of the light emitted in the direction which is substantially parallel to the surface of the substrate on which the LEDs 120 are arranged and perpendicular to the element arrays (i.e., the light emitted laterally from the light-emitting module 100). In FIGS. 3A and 3B, a region AR0 is irradiated by the most yellowish light, and regions AR1, AR2, and AR3 are irradiated by gradually less yellowish light (i.e., light closer to white) than the region AR0 in this order. The region AR3 is irradiated by substantial white light.

As shown in FIG. 3A, on one side of the light-emitting module 100 pertaining to First Embodiment in the row direction of the element arrays, the regions AR1, AR2, and AR3 as well as the region AR0 exist. In contrast, as shown in FIG. 3B, on one side of the light-emitting module 100 pertaining to the comparative example in the row direction of the element arrays, only the region AR0 exists. The light-emitting module 100 pertaining to First Embodiment differs from the light-emitting module pertaining to the comparative example in that the portion of the light emitted laterally away from the substrate 110 and irradiating the region 3 contributes to produce white light.

In conclusion, the light-emitting module 100 pertaining to First Embodiment has 11 sealing members 130 arranged such that, when the 11 sealing members 130 are viewed from the direction which is parallel to the surface on which the LEDs 120 are arranged and perpendicular to the array direction of the element arrays (i.e., viewed from the row direction of the sealing members 130), six sealing members 130 are visible such that portions of any sealing member 130 are visible without being obstructed by the sealing member 130 that is positioned closer to the viewer. Due to this arrangement, white light emitted from the visible portions of the sealing members 130 nearer to the center among the six sealing member 130 radiates laterally, without being blocked off, from the light-emitting module 100. That is to say, the portion of the light emitted laterally from the light-emitting module 100 contributes to produce white light.

Accordingly, a portion of the light emitted laterally from the light-emitting module 100 is extracted as white light and distributed to an irradiation region, which improves light utilization efficiency.

(Method of Manufacturing Light-Emitting Module)

The light-emitting module 100 pertaining to First Embodiment is manufactured according to the following procedures.

Figure 4A:
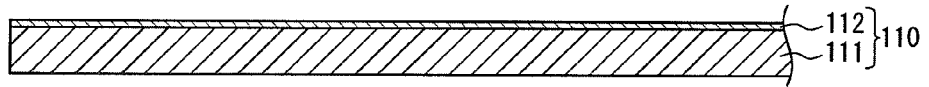
FIGS. 4A to 4G illustrate a manufacturing method of the light-emitting module pertaining to First Embodiment.

In the first procedure, a resin film made of polycarbonate is deposited on a plate 111 by a heat-fusion method or the like to form the substrate 110 comprising the plate 111 and the insulation film 112 formed thereon (see FIG. 4A).

Figure 4B:
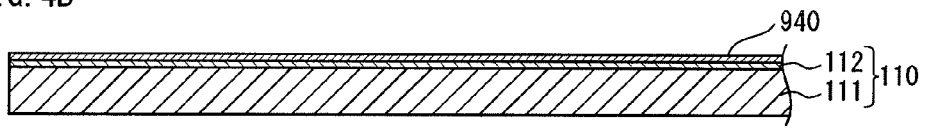
Figure 4C:
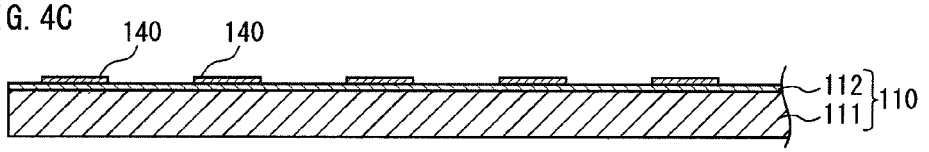

In the next procedure, a metallic layer 940 is formed on the substrate 110 (see FIG. 4B), and then the wiring pattern 140 is formed out of the metallic layer 940 using photo-lithography and etching (see FIG. 4C). Subsequently, a glass film (not shown) is formed to cover the entire substrate 110 and wiring pattern 140. Next, a resist mask is formed on the glass film using photo-lithography and etching. The resist mask is formed to cover several regions of the wiring pattern 140, the several regions including those corresponding to the lands 141, 142, and 143, excluding regions in which a plurality of LEDs 120 are to be arranged. Subsequently, the regions covering the lands 141, 142, and 143 are removed using etching to form an insulation film covering the wiring pattern except for the regions corresponding to the lands 141, 142, and 143, and the regions in which the LEDs 120 are to be arranged.

Figure 4D:
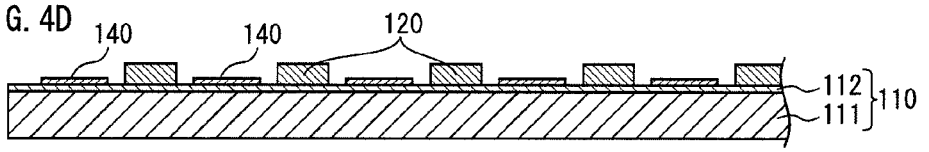

Thereafter, the LEDs 120 are arranged on the substrate 110 (see FIG. 4D). For example, the LEDs 120 are attached to the substrate 110 using an adhesive (not shown) made of a heat-conductive material or the like.

Figure 4E:
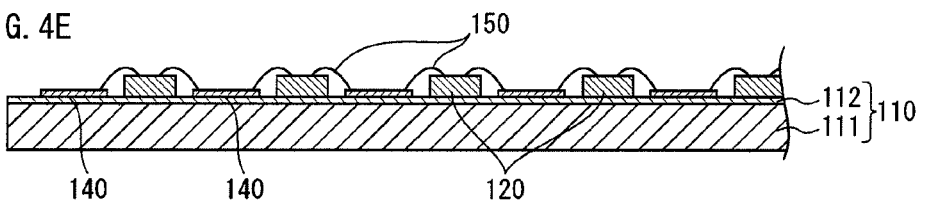

In the next procedure, electrodes of the LEDs 120 and the lands 143 are electrically connected via wires 150 by wire-bonding (see FIG. 4E).

Figure 4F:
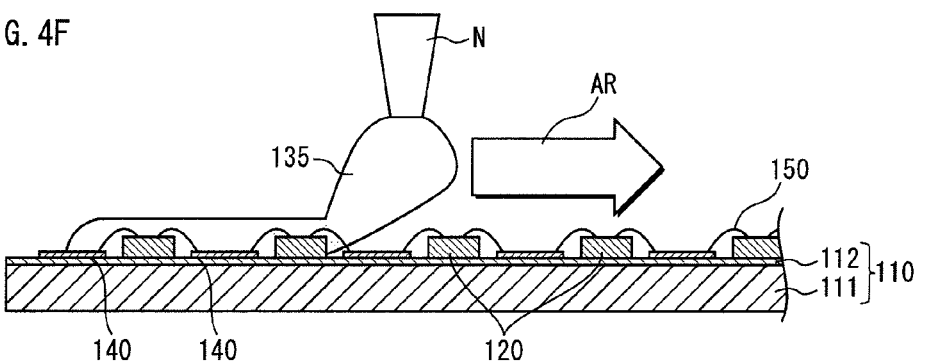
Figure 4G:
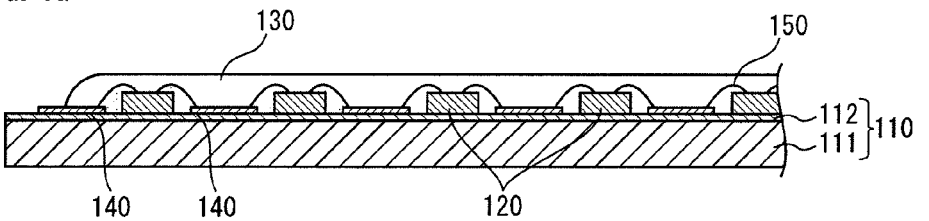

Thereafter, paste 135 is applied in lines using a dispenser N, for example, so as to extend along each element array including a plurality of LEDs 120 (see FIG. 4F). By solidifying the applied paste 135, the sealing members 130 are formed (see FIG. 4G). The above process of applying a resin paste comprises, for example, the following steps: (i) among LEDs 120 included in an element array, determine two LEDs 120 positioned at edges of the element array along the array direction of the element array; (ii) for each of the two LEDs 120 determined in the previous step, the center thereof along the short-length direction of the substrate 110 is calculated; (iii) a straight line passing through the centers is calculated, which is referred to as an arrangement axis J2 of the element arrays including 72 LEDs 120; and (iv) the resin paste is dispensed along the arrangement axis J2.

It is preferable that the viscosity of the resin paste 135 is in a range of 20 Pa s to 60 Pa s. If the viscosity of the resin paste 135 is lower than the above range, the resin paste 135 deforms immediately after the application. This makes it difficult to form the sealing members 130 in the intended shape. If the sealing members are not formed in the intended shape, unevenness in the color of emitted light occurs, and reliability of sealing may not be secured due to exposure of the wires 150 to the outside of the sealing members 130. By making the viscosity of the resin paste 135 relatively high, i.e., 20 Pa s to 60 Pa s, the end portion 131 of each sealing member 130 in the longitudinal direction thereof can be formed to have a curved surface, or to have a substantially semi-elliptic cross-section along the short-length direction of the substrate 110. Moreover, by making the viscosity of the resin paste 135 high, the phosphors contained in the resin paste 135 do not easily sink down. This produces an advantage that unevenness in the color of emitted light hardly occurs. Note that, in order to adjust the viscosity of the resin paste 135, it is preferable that the resin paste 135 contain at least 5 wt % of fillers or phosphors. For example, white fillers are acceptable. Furthermore, in order to maintain the shape of each sealing member 130, it is preferable for each sealing member 130 to have a Shore A hardness of 20 or more.

The method for forming the sealing members 130 is not limited to the above-described dispense method. For example, metal-molding may be employed. However, when this technology is used for forming light-emitting units each including a plurality of light-emitting elements, it is highly probable that unevenness in the luminance occur due to heat generated by light-emitting elements during lighting. In contrast, when the dispense method is used, each sealing member 130 is formed to have rounded edges and rounded side portions. As the result of this, the heat dissipation of the sealing members 130 is improved, which efficiently suppresses unevenness in the luminance.

Second Embodiment

Figure 5:
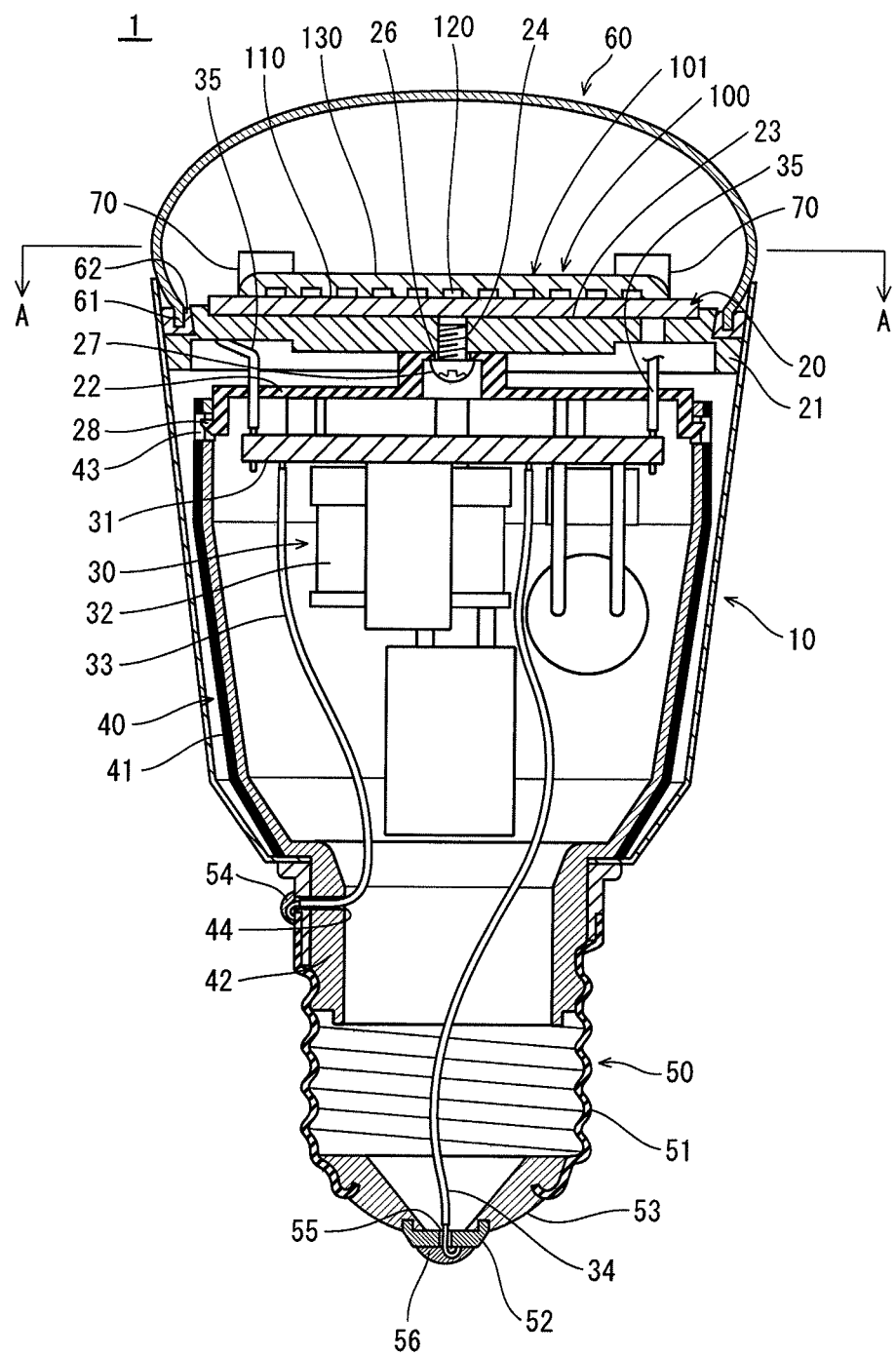
FIG. 5 is a cross-sectional view showing a lamp pertaining to Second Embodiment.
Figure 6:
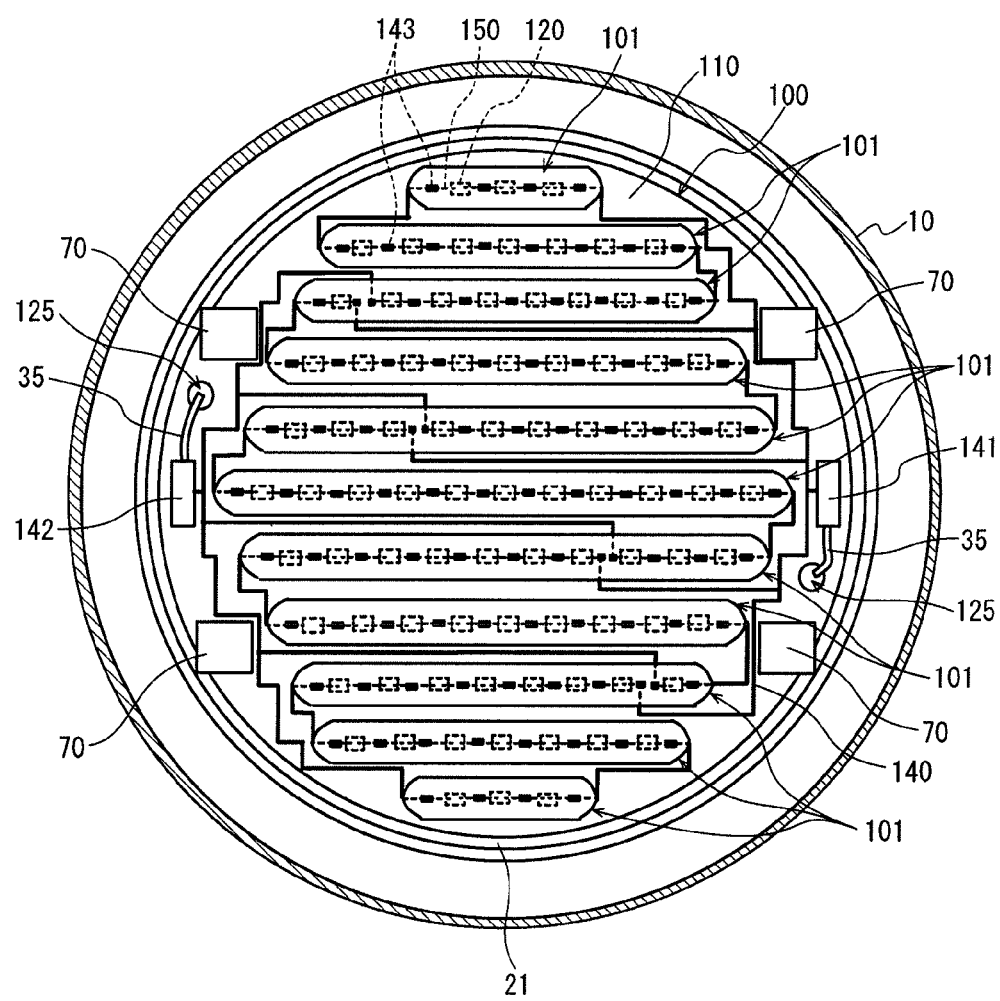
FIG. 6 is another cross-sectional view showing the lamp pertaining to Second Embodiment.

FIG. 5 is a cross-sectional view showing a lamp 1 pertaining to Second Embodiment. FIG. 6 shows a cross section taken along a line A-A in FIG. 5.

As shown in FIG. 5, the lamp 1 pertaining to the present embodiment includes a housing 10, a holder 20, a power supply unit 30, a case 40, a base 50, a globe 60, and a light-emitting module 100. Note that the light-emitting module 100 has been already described with reference to First Embodiment. Therefore, the description thereof will not be repeated.

The housing 10 has a shape of a substantially circular tube with two openings. The light-emitting module 100 is disposed at one opening, and the base 50 is disposes at the other opening. A highly heat-conductive material, for example, a metal such as aluminum, is used for the housing 10. Accordingly, the housing 10 serves as a heat dissipating member (heat sink) that dissipates heat generated by the light-emitting module 100.

The holder 20 includes a module holding portion 21 and a circuit holding portion 22.

As shown in FIG. 6, the module holding portion 21, which has a shape of a substantially circular plate, is used to attach the light-emitting module 100 to the housing 10. A substantially circular recess 23 having a shape matching that of the substrate 110 is formed in the main surface (i.e., the surface for mounting the light-emitting module 100) of the module holding portion 21, with the centers of the recess 23 and the main surface being substantially aligned. The light-emitting module 100 is fixed to the module holding portion 21 using an adhesive, with the substrate 110 fit in the recess 23 such that the bottom surface of the substrate 110 adhered to the bottom surface of the recess 23. Alternatively, the light-emitting module 100 may be screw-fastened to the module holding portion 21, for example.

In addition, a screw hole 24 is provided in the module holding portion 21 for joining the module holding portion 21 and the circuit holding portion 22. The module holding portion 21 is made of a highly heat-conductive material such as aluminum. Due to the properties of such a material, the module holding portion 21 also serves as a heat-conducting member that conducts heat from the light-emitting module 100 to the housing 10.

The circuit holding portion 22 has a substantially circular shape in a plan view. The circuit holding portion 22 has a boss hole 26 at the center thereof for joining the module holding portion 21 thereto. The circuit holding portion 22 is fixed to the module holding portion 21 by a screw 27 being inserted through the boss hole 26 into the screw hole 24 in the module holding portion 21. The circuit holding portion 22 also has a latching pawl 28 engaging with the case 40 along the outer circumference surface thereof. It is preferable that the circuit holding portion 22 is made of a material of small weight such as synthetic resin (for example, polybutylene terephthalate (PBT)).

The power supply unit 30 includes a circuit substrate 31 and a plurality of electronic components 32 mounted on the circuit substrate 31. The circuit substrate 31 is housed in the housing 10 and fixed to the circuit holding portion 22. Two lead wires 35 and power supply wires 33 and 34 are led out from the power supply unit 30.

The case 40 includes a main part 41 formed to have a cylindrical shape for housing the power supply unit 30, and a base attachment portion 42 that extends from one end of the main part 41 in the tube axial direction thereof and has a smaller diameter than the main part 41. The main part 41 has a latching hole 43 provided for engaging with the latching pawl 28 of the circuit holding portion 22. The case 40 is attached to the circuit holding portion 22 by the engagement between the latching pawl 28 and the latching hole 43. The case 40 is made of a synthetic resin such as polybutylene terephthalate.

The base 50 conforms to, for example, the standard for an Edison screw specified in Japanese Industrial Standards (JIS), and is used by being attached to a socket designed for a general incandescent light bulb. More specifically, an E26 base is used as the base 50 when the lamp 1 corresponds to a 60-watt incandescent light bulb, and an E17 base is used when the lamp 1 corresponds to a 40-watt incandescent light bulb.

The base 50 includes a shell 51 having a tubular shape, an eyelet 52 having a shape of a circular dish, and an insulation member 53 made of an insulating material such as glass and electrically insulating the shell 51 and the eyelet 52. The base 50 is attached to the case 40 with the shell 51 fit around the base attachment portion 42. A through hole 44 is formed in the circumferential wall of the base attachment portion 42. A power supply wire 33 from the power supply unit 30 passes through the through hole 44 and leads out from the base attachment portion 42. The portion of the power supply wire 33 outside the base attachment portion 42 is connected to the shell 51 by soldering 54. Another through hole 55 is formed in the eyelet 52 substantially at the center thereof. Another power supply wire 34 from the power supply unit 30 passes through the through hole 55 and leads out from the eyelet 52. The portion of the power supply wire 34 outside the eyelet 52 is connected to the eyelet 52 by soldering 56.

The globe 60 substantial has a shape of a dome and mounted to cover the light-emitting module 100. The globe 60 is fixed by an adhesive 62 with an opening end 61 thereof being disposed between the housing 10 and the module holding portion 21.

Four reflection members 70 are disposed on the substrate 110 of the light-emitting module 100 for reflecting a portion of light which is substantially white and emitted out of the sealing members 130 in the row direction of the element arrays. The reflection member 70 is made of a polycarbonate resin or the like.

Figure 7:
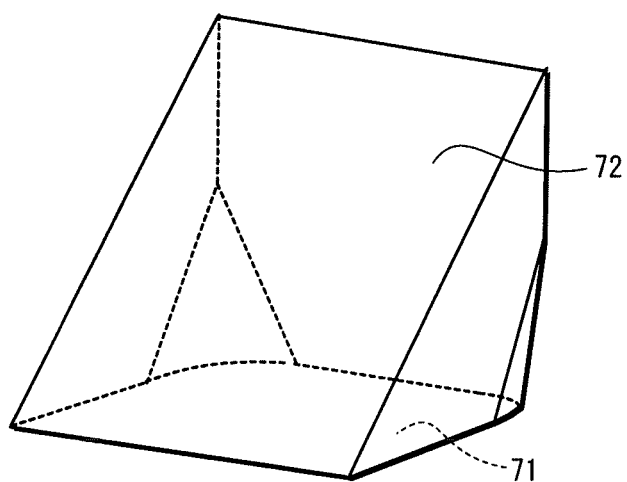
FIG. 7 is a perspective view showing a reflection member pertaining to Second Embodiment.

FIG. 7 is a perspective view showing the reflection member 70. The reflection member 70 is substantially prism shaped and has a bottom surface 71 being an attachment surface for attachment to the substrate 110 and reflection surface 72 for reflecting light which is emitted out of the sealing members 130 in the row direction of the element arrays. The bottom surface 71 has two corners formed to have a shape which is curved and therefore matches the outer circumference of the substrate 110. The reflection member 70 is fixed by an adhesive (not shown) with the bottom surface thereof being in contact with the surface of the substrate 110.

As shown in FIG. 5, the light-emitting module 100 is attached to the module holding portion 21 of the holder 20. As shown in FIG. 6, a pair of lead wires 35 from the power supply unit 30 are connected to the lands 141 and 142 partially constituting the wiring pattern 140. The LEDs 120 are power-supplied from the power supply unit 30 via the lead wires 35.

In Second Embodiment described above, a bulb-type LED lamp is employed as a lighting source. The lighting source is not limited to the bulb-type LED lamp. Any lamp may be employed as long as it is structured to be able to substitute for a halogen lamp.

Third Embodiment

Figure 8A:
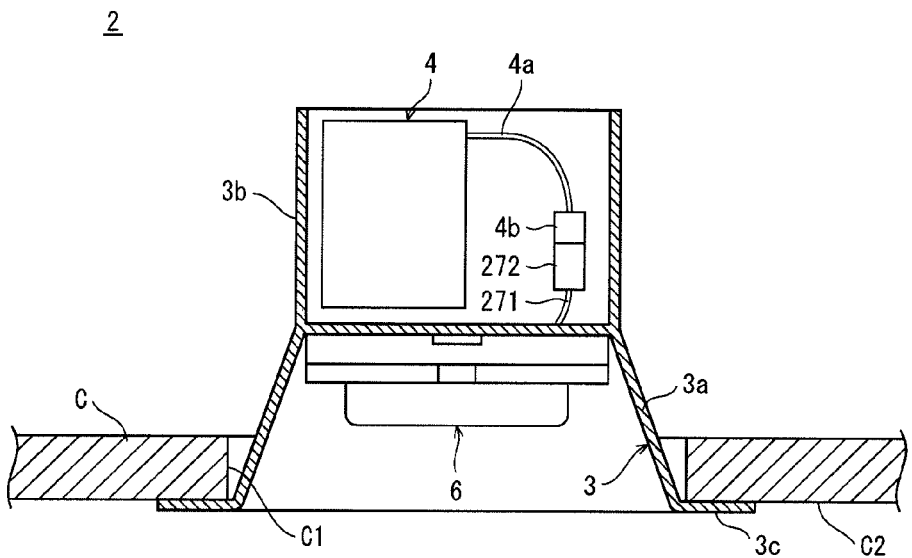
FIG. 8A is a cross-sectional view showing a lighting device pertaining to Third Embodiment.

FIG. 8A is a cross-sectional view showing a lighting device 2 pertaining to Third Embodiment.

The lighting device 2 is a so-called down-light which is installed into an opening formed in a ceiling C. The lighting device 2 is provided with a tool 3, power supply unit 4, and lamp unit 6 being a lighting source.

The tool 3 is made of metal, and including a lamp housing part 3a, circuit housing part 3b, and outer jaw 3c. The lamp housing part 3a has a shape of a bottomed-cylinder. The lamp unit 6 is detachably mounted inside the lamp housing part 3a, specifically, on the bottom thereof. The circuit housing part 3b is formed to extend from the bottom on the opposite side to the lamp housing part 3a. The circuit housing part 3b accommodates the power supply unit 4. The outer jaw 3c has an annular shape, and is formed to extend outwards from the edge of the opening of the lamp housing part 3a.

In summary, the tool 3 has a cylindrical shape which is divided into two portions by a partition board 3d near the center thereof in a direction perpendicular to the ceiling C. The lamp unit 6 is accommodated in an internal space defined between the partition board 3d of the tool 3 and the end thereof proximal to the ceiling C (i.e., the bottom end). The power supply unit 4 is accommodated in another internal space defined between the partition board 3d of the tool 3 and the end thereof distal to the ceiling C (i.e., the top end).

The tool 3 is attached to the ceiling C, with the lamp housing part 3a and circuit housing part 3b embedded in an embedding hole C1 bored in the ceiling C, and with the outer jaw 3c being in contact with the lower surface of ceiling in a region thereof which surrounds the embedding hole C1.

The power supply unit 4 includes a lighting circuit therein for lighting the lamp unit 6. The power supply unit 4 also has a power wire 4a which is electrically connected to the lamp unit 6. The power wire 4a has a connecter 4b attached to the end thereof. The connecter 4b is detachably connected to a connecter 272 which is connected to a lead wire 271 of the lamp unit 6.

The lighting circuit converts power supplied from the commercial AC power source, and supplies the converted power to the light-emitting module 100.

Figure 8B:
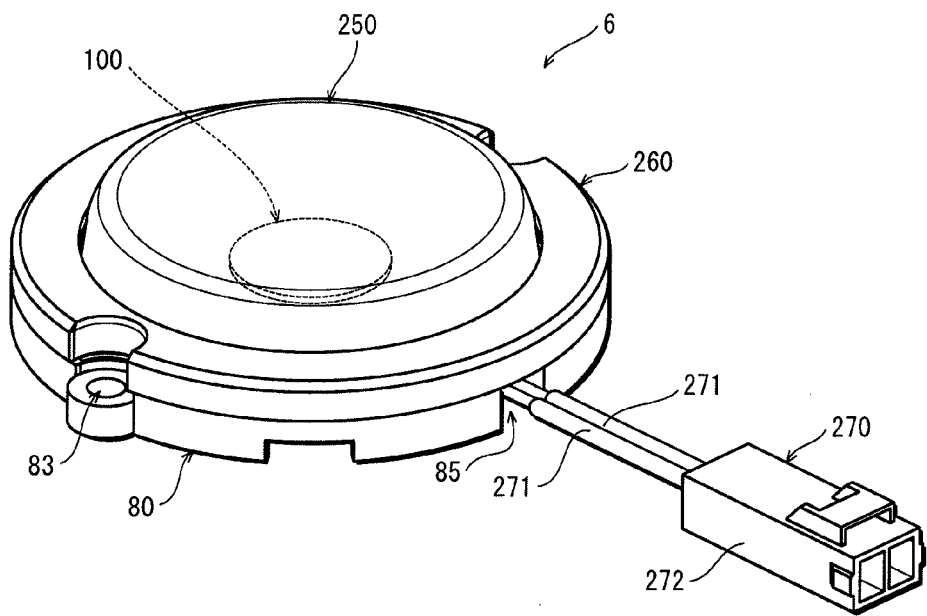
FIG. 8B is a perspective view showing a lamp unit pertaining to Third Embodiment.

FIG. 8B is a perspective view showing the lamp unit 6.

The lamp unit 6 includes therein the light-emitting module 100. The lamp unit 6 also includes a base 80, cover 250, frame 260, wiring member 270, and so on. The lamp unit 6 is disposed in the lamp housing part 3a of the tool 3, more specifically, fixed on the partition board 3d of the tool 3.

The base 80 is made of, for example, a material having high thermal conductivity. The examples of the material include metal such as aluminum. The base 80 is made by aluminum die-casting and has a disk-like shape. The base 80 has the light-emitting module 100 mounted thereon substantially at the center of the upper surface thereof. The base 80 also has insert holes 83 formed in the periphery thereof for attaching the lamp unit 6 to the tool 3.

The cover 250 is made of a light-transmitting material such as a silicone resin, acrylic resin, and glass. Accordingly, light emitted from the light-emitting module 100 passes through the cover 250 and is radiated to the outside of the lamp unit 6.

The frame 260 is made of a light-non-transmitting material. The examples of the light-non-transmitting material include metal such as aluminum and a white opaque resin. The frame 260 has a shape of an annular plate so as not to block off light emitted through the central portion of the cover 250. The periphery of the cover 250 is clamped between the frame 260 and the base 80.

The wiring member 270 has a pair of lead wires 271 electrically connected to the light-emitting module 100. The lead wires 271 are led out from the lamp unit 6 through a notch 85 formed in the base 80. One end of each lead wire 271 is commonly connected to a connecter 272. The other end thereof opposite to the connecter 272 is connected to the light-emitting module 100.

Though Third Embodiment exemplifies a down-light, it is not limited thereto. Other lighting devices having different structures may be acceptable.

(Modifications)

Figure 9:
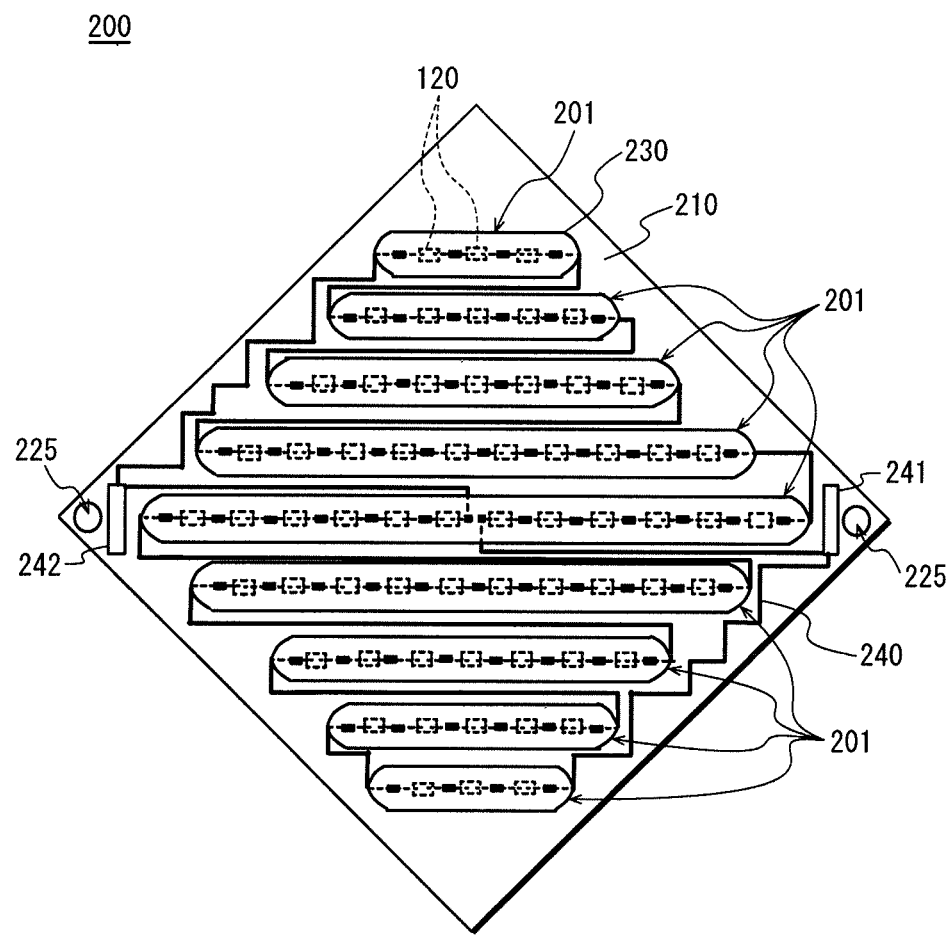
FIG. 9 is a plan view showing a light-emitting module pertaining to a modification.

(1) First Embodiment exemplifies a case in which the substrate 110 of the light-emitting module 100 has a circular shape in a plan view. The shape of the substrate 100 is not limited thereto. For example, as shown in FIG. 9, a light-emitting module 200 may have a substrate 210 of a rectangular shape in a plan view. The substrate 210 has a wiring pattern 240 formed thereon for electrically connecting between LEDs 120. Through holes 225 are bored at two corners facing each other across the center of the substrate 210. Lands 241 and 242 are formed in the vicinity of the through holes 225 in the substrate 210, respectively. Each of the lands is positioned on one of the sides of the corresponding through hole, the one being the side nearer to the center of the substrate 210. Nine elongated light-emitting units 201 are arranged on the substrate 210, each light-emitting unit 201 being constructed by an element array and a sealing member 230 sealing the element array. The element array includes a plurality of LEDs 120 arranged in a line in an arrangement direction of the through holes 225 formed in the substrate 210. In total, 62 LEDs are included in the nine light-emitting units 201.

Among the plurality of light-emitting units 201, the one positioned to pass the center of the substrate 210 has the largest length in the longitudinal direction thereof. Among the other light-emitting units 201, one positioned nearer to a corner of the substrate 210 has smaller length in the longitudinal direction thereof. The wiring pattern 240 is formed to connect two series circuits in parallel, each series circuit including 31 LEDs 120 connected in series. Accordingly, the same voltage is applied to each of the 62 LEDs 120, which achieves evenness in the luminance of the LEDs 120.

Figure 10:
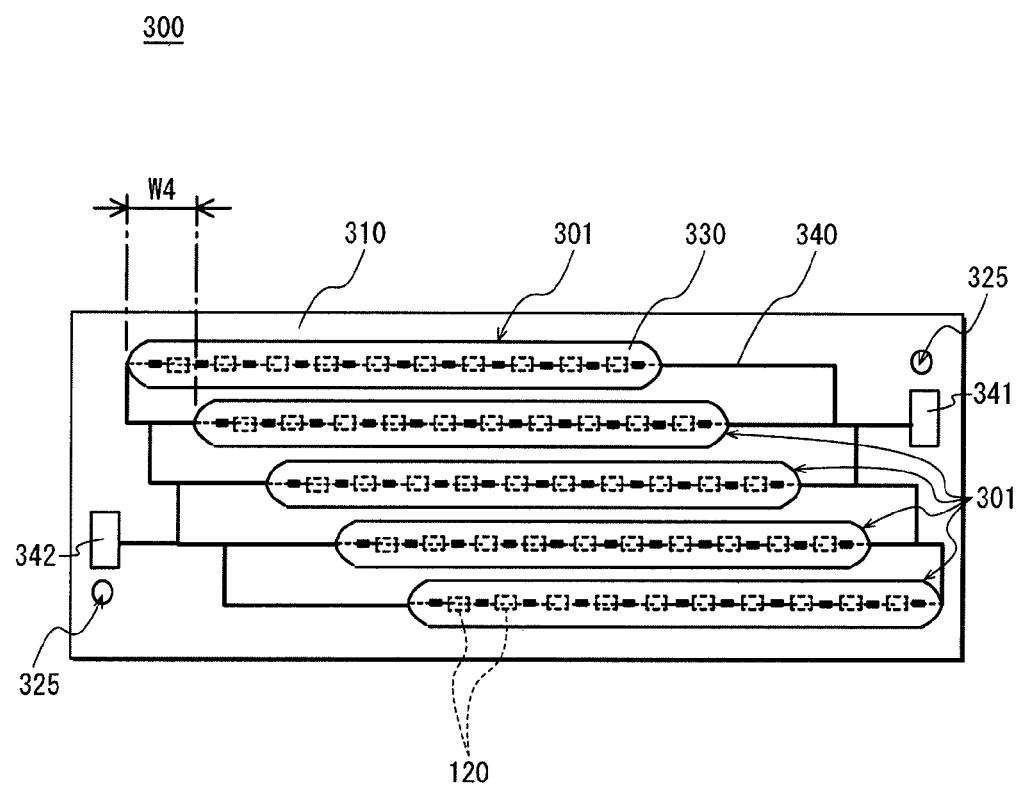
FIG. 10 is a plan view showing a light-emitting module pertaining to a modification.

(2) First Embodiment exemplifies a case in which the light-emitting module 100 includes light-emitting units 101 whose lengths differ gradually. The present invention is not limited thereto. FIG. 10 shows an alternative example, in which the light-emitting units 101 of the same length are arranged such that each light-emitting unit 101 has the both ends thereof in the longitudinal direction positioned to be offset from those of the adjacent light-emitting unit 101. In this arrangement, it is preferable that end portions of any two sealing members 330, which are adjacent to each other in the row direction of the sealing members 330, are offset from each other in the longitudinal direction of the sealing members 330 by at least length W4 in FIG. 10, the length W4 corresponding to the length of one LED 120. This enables increase in intensity of white light which is emitted out of the outer circumference surface of the sealing members 330 and reaches the outer periphery of the substrate 310.

Figure 11A:
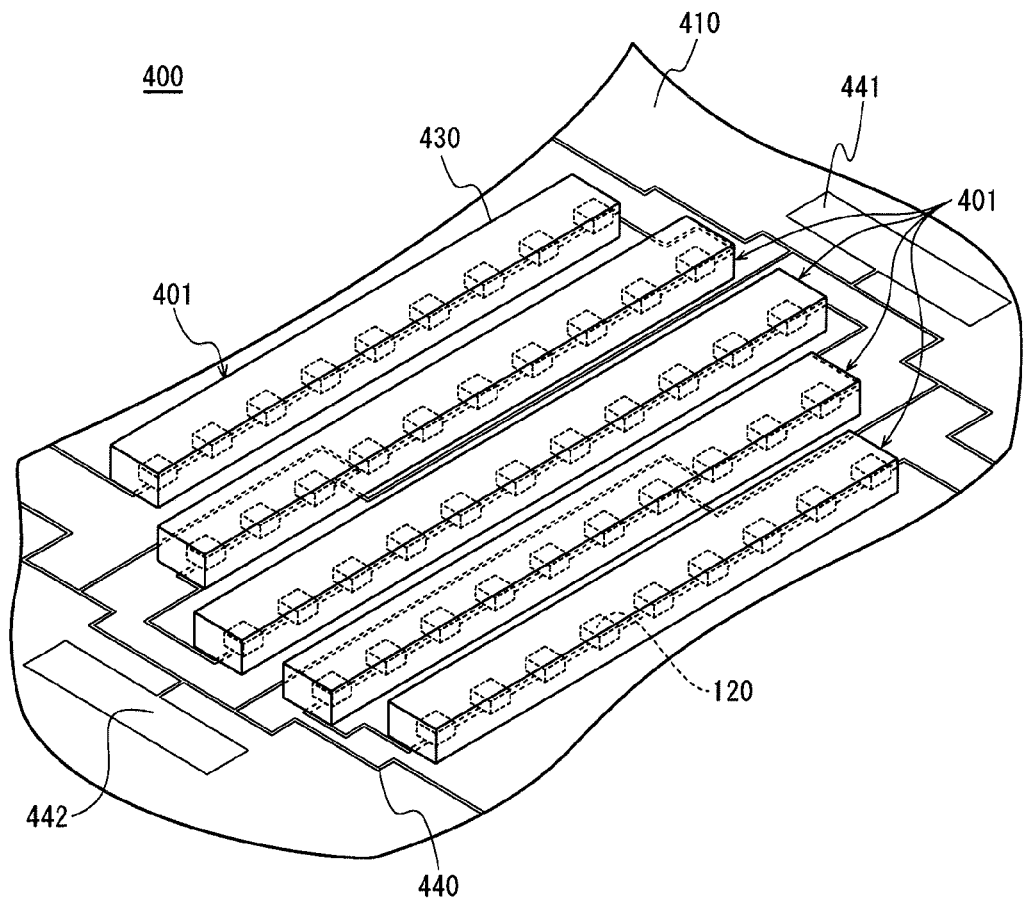
FIG. 11A is a partial perspective view showing a light-emitting module pertaining to a modification.
Figure 11B:
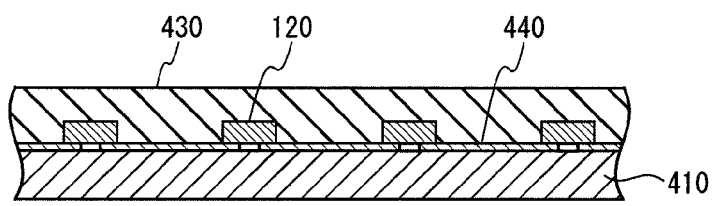
FIG. 11B is a partial cross-sectional view showing a light-emitting module pertaining to the modification.

(3) First Embodiment exemplifies a case in which the LEDs 120 arranged on the substrate 110 by face-up mounting. The present invention is not limited thereto. FIGS. 11A and 11B show an alternative example, in which the LEDs 120 are arranged on the substrate 410 by flip-chip mounting. In this example, electrodes of each LED 120 are directly connected to the wiring pattern 440, and the wiring pattern 440 and the LEDs 120 are sealed by the sealing members 430. The wiring pattern 440 includes lands 441 and 442 for the connection with an external power source.

(4) First Embodiment exemplifies a case in which any two sealing members 130 are in a positional relationship such that one of the sealing members 130 which is nearer to one edge of the substrate 110 in the row direction of the sealing members 130 is shorter in length in the longitudinal direction thereof than the other of the sealing members 130. The present invention is not limited thereto. Any other example falls within the scope of the present invention as long as the sealing members 130 are arranged such that, when the sealing members 130 are viewed from the direction which is parallel to the surface on which the LEDs 120 are arranged and perpendicular to the array direction of the element arrays, at least two of them are in a positional relationship such that a portion of one of the sealing members which is nearer to the center of the substrate is visible without being obstructed by the other of the sealing members.

Figure 12:
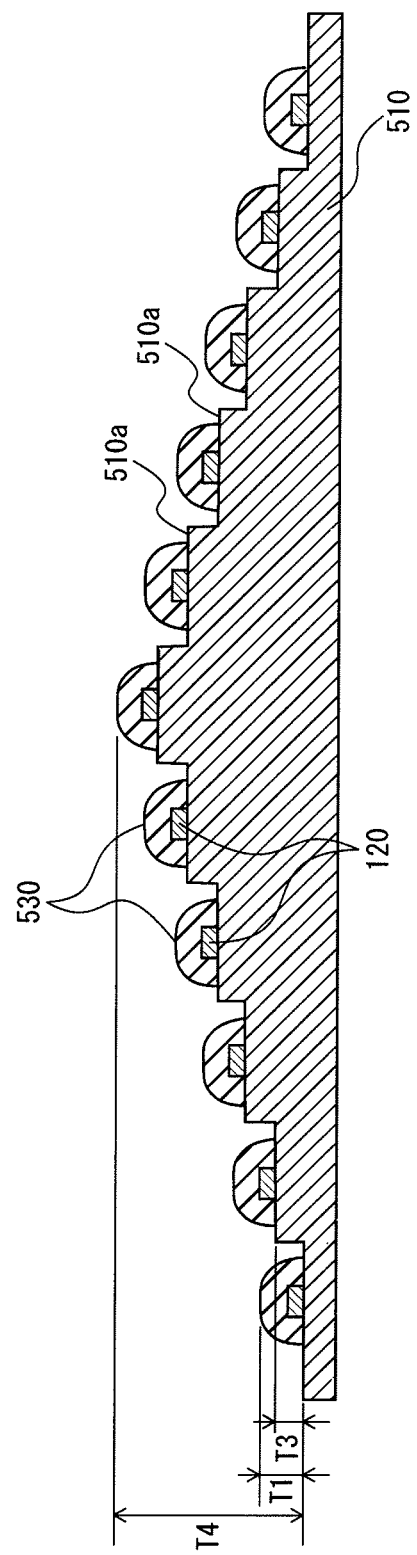
FIG. 12 is a cross-sectional view showing a light-emitting module pertaining to a modification.

FIG. 12 shows an alternative example, in which the substrate 510 has a plurality of steps 510a of different heights formed on the surface thereof, the steps each having LEDs arranged thereon. In this example, the difference T3 in height between each two adjacent steps 510a is smaller than the thickness T1 of a sealing member 530. When the 11 sealing members 530 are viewed from a direction which is parallel to the surfaces (of the steps 510a) on which the LEDs 120 are arranged and perpendicular to the array direction of the element arrays, six sealing members 530 are visible, and any adjacent two of them are positioned such that substantially upper half of one sealing member 530 nearer to the center of the substrate is visible without being obstructed by the other one. The differences in height between steps on the substrate 510 are determined such that the height T4 from the lowest surface on which the lowest step is formed to the top of the sealing member 530 on the highest step is optimum for the thickness of a lamp in which the light-emitting module 500 is to be mounted.

Figure 13A:
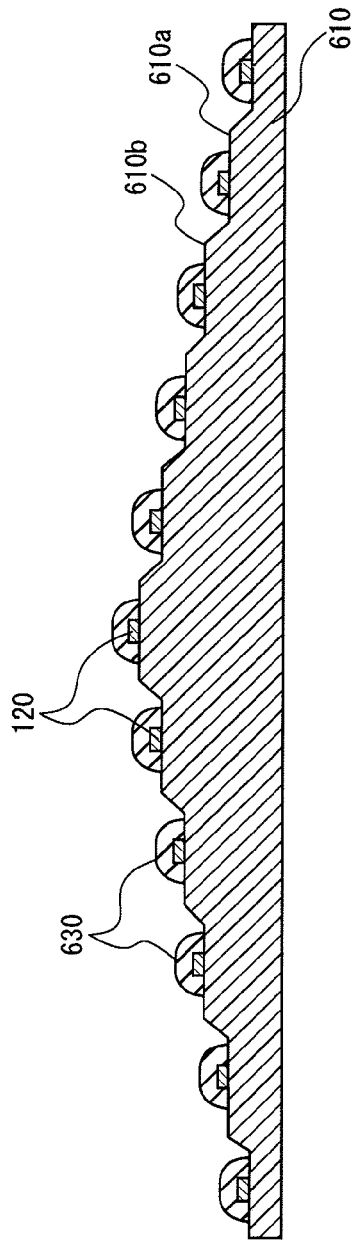
FIGS. 13A and 13B are cross-sectional views showing a light-emitting module pertaining to a modification.
Figure 13B:
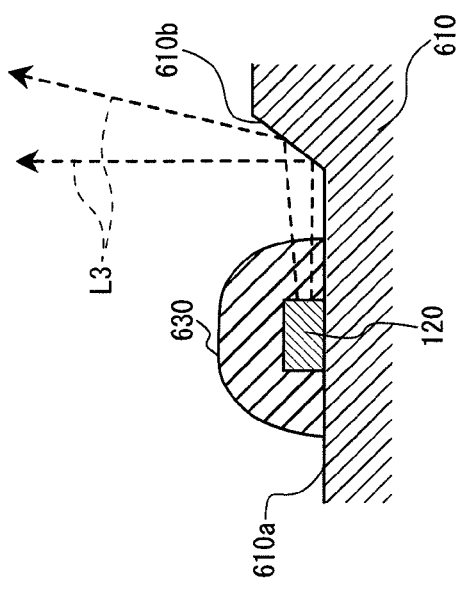

FIG. 13A shows a further alternative example, in which the substrate 610 has a plurality of pairs of a flat step 610a and a slope 610b. Each flat step has LEDs 120 and a sealing member 130 arranged thereon. Each slope 610b is inclined to intersect the surface of the step 610a. Accordingly, as shown in FIG. 13B, light emitted from the LED 120 through the sealing member 630 towards the slope 610b is reflected by the slope 610b upward from the substrate 110 as indicated by arrows L3 in FIG. 13B. Accordingly, the utilization efficiency of the light emitted from the LED 120 through the sealing member 630 is improved.

Figure 14:
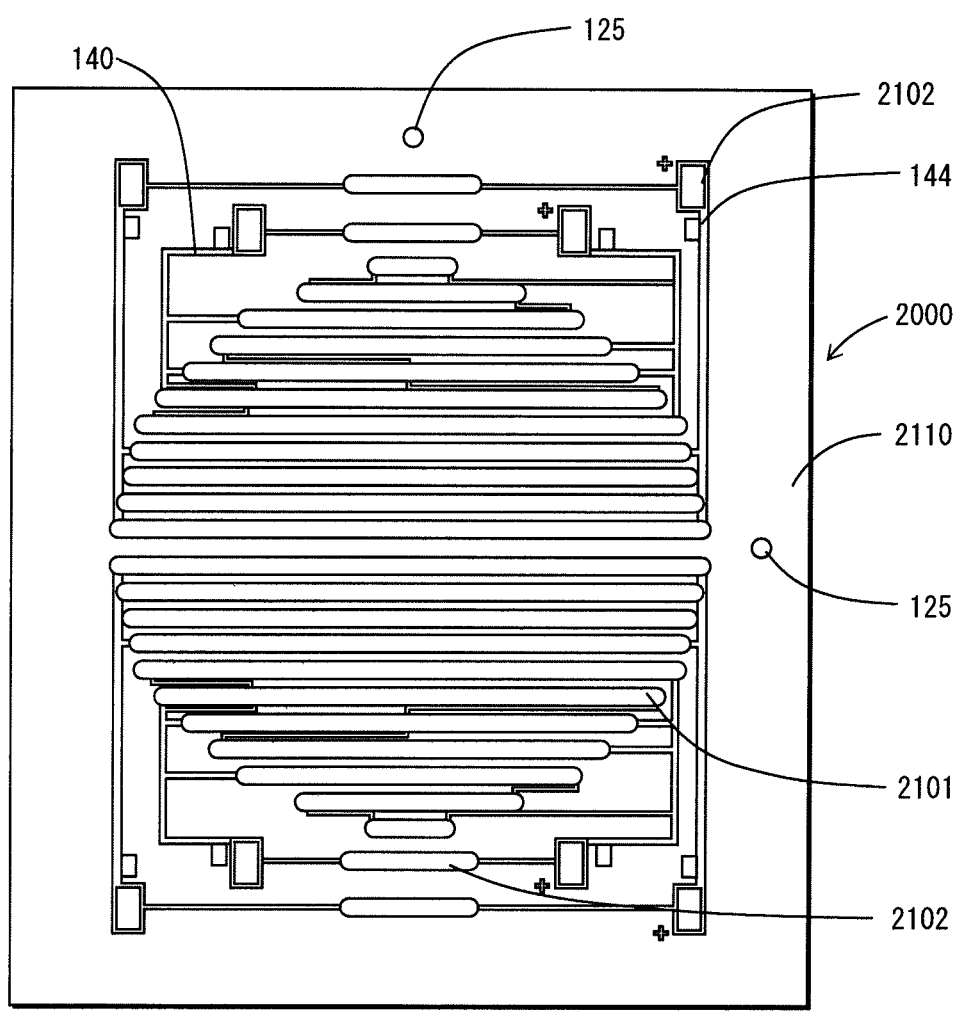
FIG. 14 is a plan view showing a light-emitting module pertaining to a modification.

(5) FIG. 14 shows another embodiment pertaining to the present invention, which is directed to a light-emitting module 2000 provided with a plurality of light-emitting units 2101 on a substrate 2110 (i.e., a light-emitting module with four circuits). The substrate 2110 has protection devices 2102 arranged thereon outside a region thereof in which the plurality of light-emitting units 2101 are arranged. The protection devices 2102 are each sealed by a sealing member. The protection devices 2102 are generally provided in the vicinity of LEDs (not shown) for protecting them from static electricity, and the like. However, the protection devices 2102 absorb a portion of light emitted from the LEDs. In contrast, according to the present invention, a plurality of light-emitting units 2101, each including a plurality of light-emitting elements sealed in entirety, are arranged such that at least two light-emitting units 2101 are in a positional relationship such that end portions of the two light-emitting unit 2101 do not overlap. Due to this arrangement, an insulation distance can be secured, which enables each protection device 2102 to be disposed at a position away from the light-emitting units 2101 (i.e., outside the region in which the plurality of light-emitting units 2101 are formed). This suppresses absorption of light by the protection devices 2102. Note that, in FIG. 14, the parts described above with reference to the present invention are denoted by the same reference numerals used in the description. The description of such parts is not repeated.

(6) The above-described light-emitting module 2000, which has the protection devices 2102 disposed outside the region in which the light-emitting units 2101 are arranged, is useful as the light source of a lamp 2200 shown in FIG. 15, for example, which has an opening 2201 of a circular shape in a plane view. The lamp 2200 also includes an outer shell 2201 having an annular shape in a plan view, and an inner shell 2202 disposed inside the outer shell 2201 and having an annular shape in a plan view.

Figure 15B:
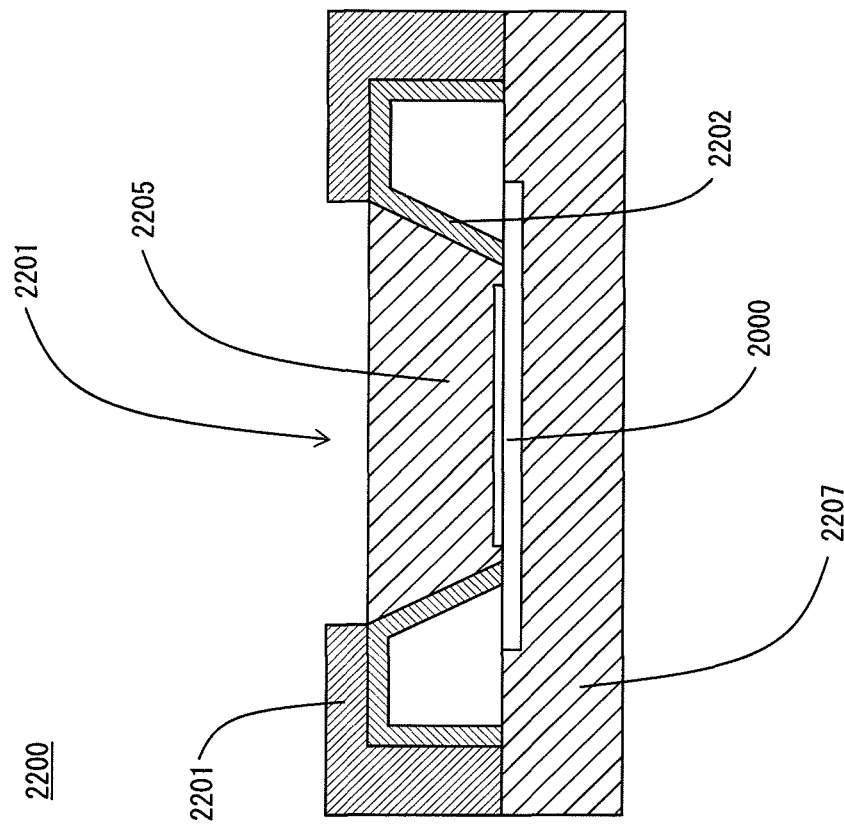
FIG. 15B is a cross-sectional view showing a lamp employing the light-emitting module shown in FIG. 13.

As shown in FIG. 15B, the lamp 2200 is provided with a heat sink 2207 comprising a metal plate. The outer shell 2201 is disposed on the main surface of the heat sink. The inner shell 2202 is disposed in a gap defined between the outer shell 2201 and the heat sink 2207. In the space inside the inner shell, an optical member 2205 made of glass (also referred to as "protective glass") is disposed so as to close the opening 2201.

Figure 15A:
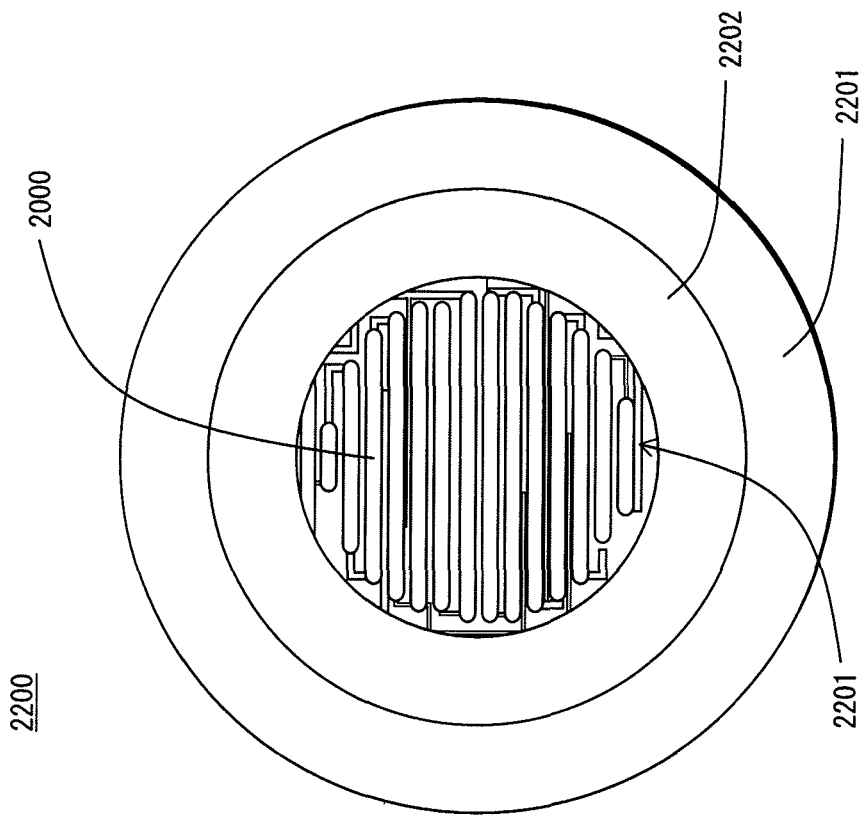
FIG. 15A is a plan view showing a light-emitting module pertaining to a modification.

In the light-emitting module 2000 pertaining to the present invention, a plurality of light-emitting units are separately formed, and the protection devices are disposed outside the region in which the light-emitting unit are formed. Accordingly, appropriate modifications are able to be made to the arrangement of arrays of the light-emitting elements, the shape of the sealing member, and the like. This enables the shape of the light-emitting units 2101 to be determined easily in accordance with the shape, size, and the like of the opening 2201, as shown in FIG. 15B. When the light-emitting module 2000 is attached to the lamp 2200 with the opening 2201 having a circular shape in a plane view, as shown in FIG. 15A, the reflection surface formed on the inner surface of the inner shell 2202 enables light emitted from the light-emitting module 2000 to be radiated to the outside through the opening 2201 to which the optical member 2205 is attached. Due to this, the lamp has high light-extraction efficiency. The protection devices 2102 need not to be disposed in one place together, and may be distributed in more than one place.

(7) As described above, the number of circuits used for constituting the light-emitting module pertaining to the present invention is not specifically limited. For example, the light-emitting module may be constituted using two or more circuits. In general, when a plurality of circuits are used, there is concern over the complexity of a wiring pattern. In contrast, the light-emitting module pertaining to the present invention in which light-emitting units are separately disposed requires no complex wiring pattern.

(8) It is described above, with reference to First Embodiment, that the light-emitting module 100 having the wiring pattern 140 and LEDs 120 (not shown) connected via the land 143 and wires is useful from the point of view of both cost and light-extraction efficiency.

Figure 16:
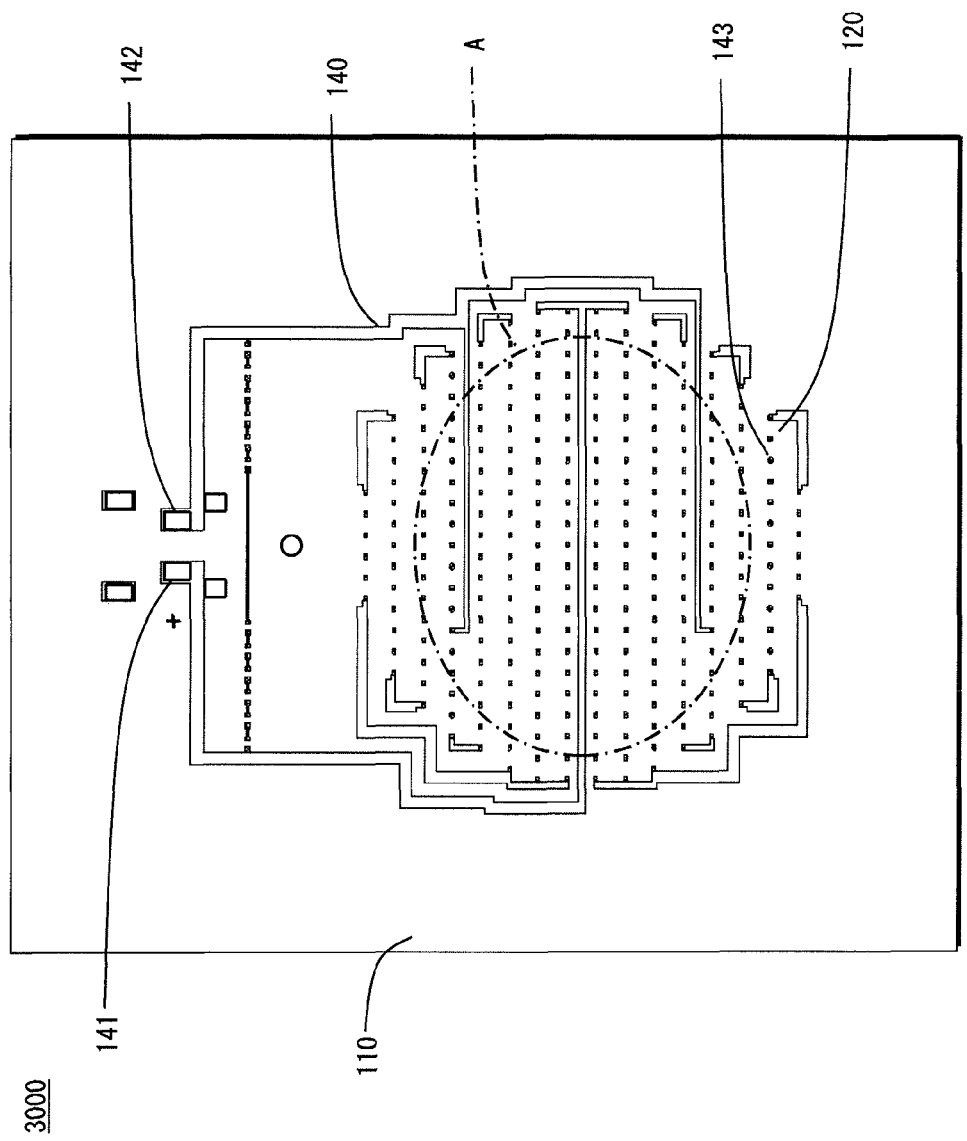
FIG. 16 is a plan view showing a wiring pattern on a light-emitting module pertaining to a modification before LEDs are mounted.

For this reason, a light-emitting module 3000 as shown in FIG. 16 is preferable. In the light-emitting module 3000, a large number of LEDs are arranged in a relatively small region and thus in high density on the substrate 100. In FIG. 16, this region is shown as the region A which is enclosed by a dashed line and positioned in the central region in which the diagonal lines of the substrate intersect. A linear wiring pattern 140 connected to a power feeding terminal (not shown) via the lands 141 and 142 is provided to extend to the region A. In this arrangement, the wiring pattern 140 serves as a heat transfer means. This enables effective heat dissipation from the region A, in which the LEDs are arranged in high density and, therefore, heat tends to be accumulated, to the peripheral region of the substrate 110 in which the power feeding terminal is mounted. Accordingly, the temperature of the light-emitting module 3000 is reduced efficiently, which, in turn, reduces heat transferred to the LEDs 120. This improves the luminous efficiency of the light-emitting module 3000.

(9) The light-emitting module 100 pertaining to First Embodiment is not limited to a module in which all the plurality of light-emitting units 101 emit the same color of light. For example, the light-emitting units 101 included in different arrays may emit light in different luminescent color (color temperature).

Figure 17:
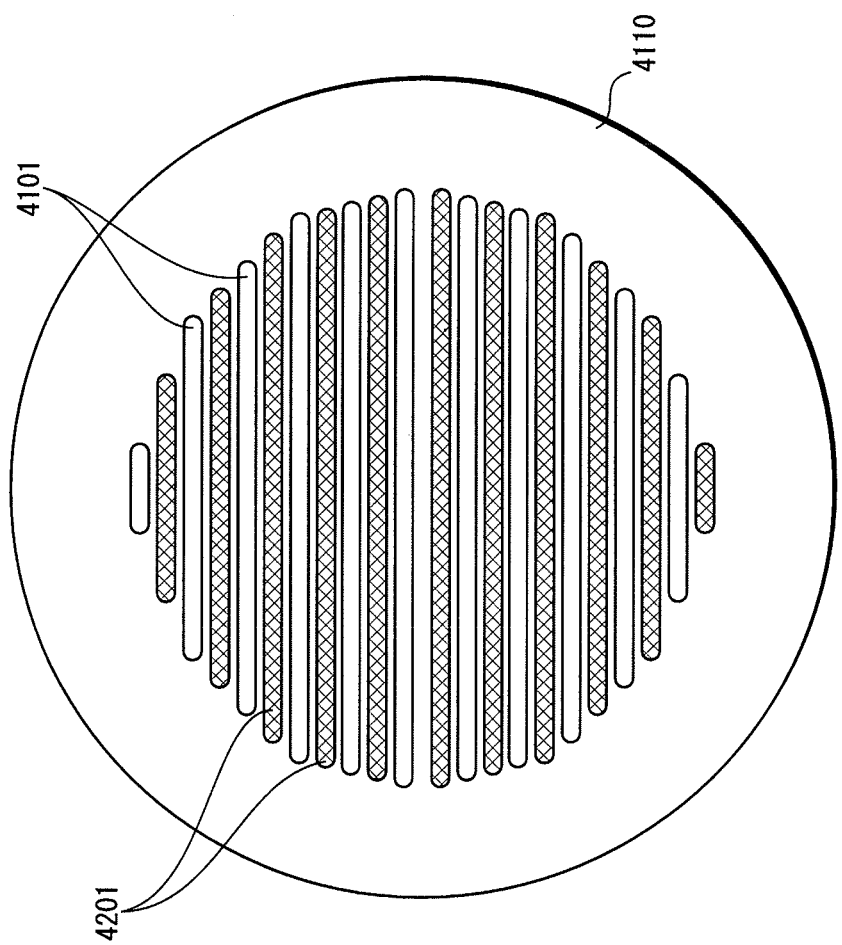
FIG. 17 is a plan view showing a light-emitting module pertaining to a modification.

FIG. 17 is a plan view showing a light-emitting module 4000 pertaining to the present modification.

The light-emitting module 4000 includes a substrate 4110 having a disk-like shape, and two types of light-emitting units 4101 and 4201. The substrate 4110 has wiring patterns (not shown) formed thereon for supplying power to the light-emitting units 4101 and 4201, respectively. The light-emitting unit 4101 emits light having a color temperature of approximately 2000 K. The light-emitting unit 4201 emits light having a color temperature of approximately 7000 K. The light-emitting module 4000 emits light mixed from the light emitted by the light-emitting units 4101 and the light emitted by the light-emitting units 4201.

The light-emitting units 4101 each include a plurality of LEDs sealed by a light-transmitting material containing yellow phosphor. The light-emitting units 4201 each include a plurality of LEDs sealed by a light-transmitting material containing green phosphor. The LEDs are the above-mentioned GaN-based LEDs that emit blue light (for example, light having a wavelength of not less than 400 nm and not more than 480 nm). The above-mentioned YAG phosphor is acceptable as the yellow phosphor. The above-mentioned silicate phosphor is acceptable as the green phosphor. The above-mentioned silicone resin and the like is acceptable as the light-transmitting material.

In the light-emitting module 4000, power is supplied to the light-emitting unit 4101 and the light-emitting unit 4201 from different power supplies. This enables the light intensity of the light-emitting unit 4101 and that of the light-emitting unit 4201 to be adjusted individually. The color temperature of the light emitted by the light-emitting module 4000 is able to be changed by adjusting the ratio of the light quantity of the light-emitting unit 4101 and that of the light-emitting unit 4201.

Figure 18:
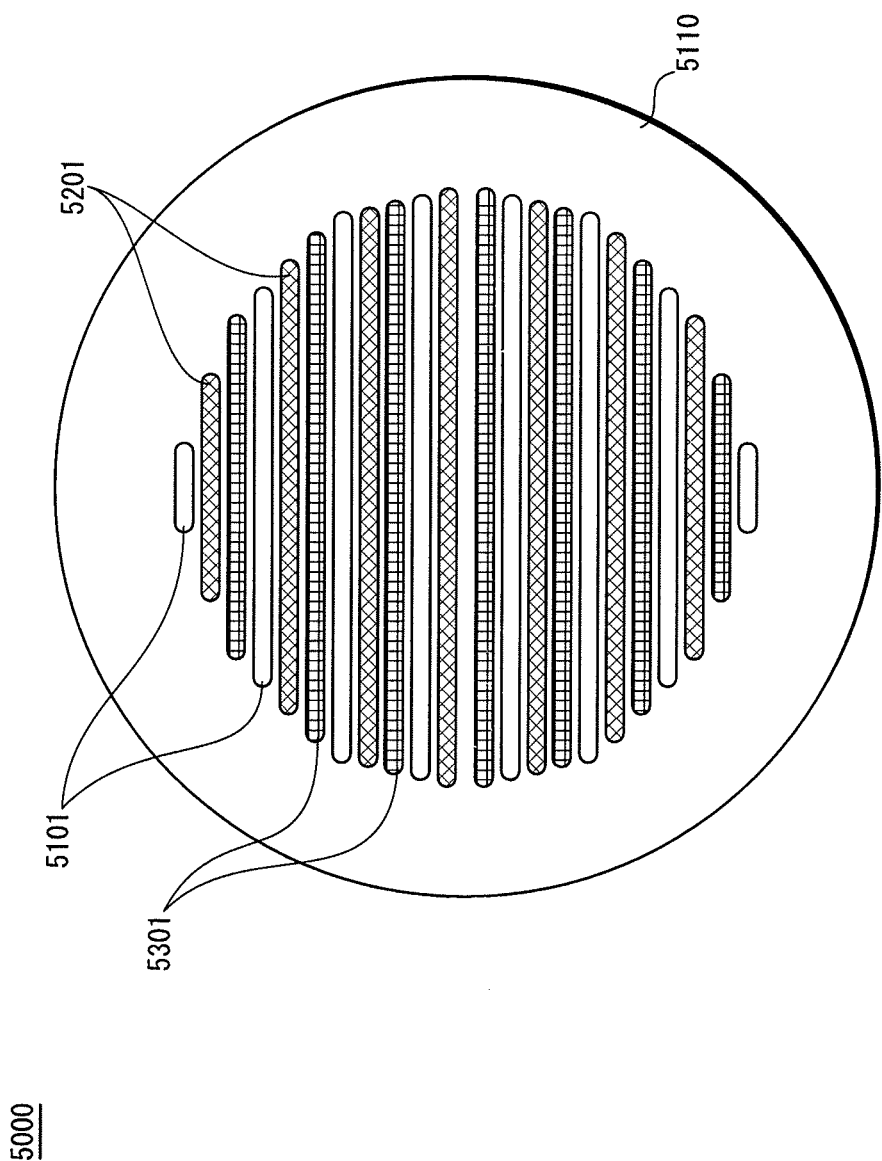
FIG. 18 is a plan view showing a light-emitting module pertaining to a modification.

FIG. 18 is a plan view showing a light-emitting module 5000 pertaining to another modification.

The light-emitting module 5000 includes a substrate 5110 having a disk-like shape and three types of light-emitting units 5101, 5201, and 5301. The substrate 5110 has wiring patterns (not shown) formed thereon for supplying power to the light-emitting units 5101, 5201, and 5301, respectively. The light-emitting unit 5101 emits blue light. The light-emitting unit 5201 emits green light. The light-emitting unit 5301 emits red light. The light-emitting module 5000 emits light mixed from the lights emitted by light-emitting units 5101, 5201, and 5301.

The light-emitting units 5101 each include a plurality of LEDs sealed by a transparent material. The light-emitting units 5201 each include a plurality of LEDs sealed by a light-transmitting material containing green phosphor. The light-emitting units 5301 each include a plurality of LEDs sealed by a light-transmitting material containing red phosphor. The LEDs are the above-mentioned GaN-based LEDs that emit blue light (for example, light having a wavelength of not less than 400 nm and not more than 480 nm). The above-mentioned silicate phosphors are acceptable as the green phosphor. Yttrium oxide phosphor ($Y_2O_3$: $Eu^+$) are acceptable as the red phosphor, for example. The above-mentioned silicone resin or the like is acceptable as the light-transmitting material.

In the light-emitting module 5000, power is supplied to the light-emitting units 5101, 5201, 5301 from different power supplies. This enables the light intensity of the light-emitting units 5101, 5201, and 5301 to be adjusted individually.

The color temperature of the light emitted by the light-emitting module 5000 is able to be changed by adjusting the ratio of the light quantities of the light-emitting units 5101, 5201, and 5301.

(10) First Embodiment exemplifies a case in which the LEDs 120 are electrically connected via the lands 143. The method for electrically connecting the LEDs 120 is not limited the one using the lands 143.

Figure 19:
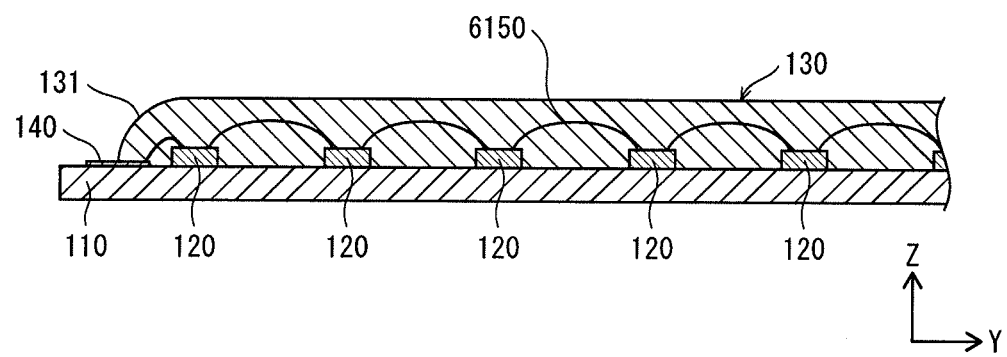
FIG. 19 is a cross-sectional view showing a light-emitting module pertaining to a modification.
Figure 20:
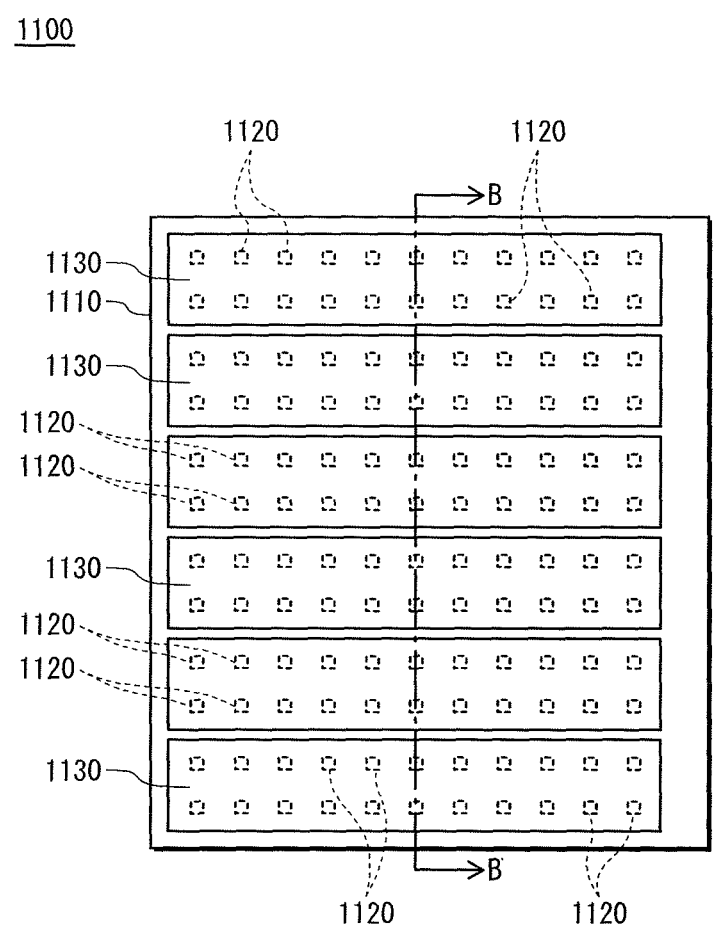
FIG. 20 is a plan view showing a conventional light-emitting module.

FIG. 19 is a cross-sectional view showing a portion of a light-emitting module pertaining to the present modification.

Each two adjacent LEDs 120 have the electrodes thereof connected by a wire 6150.

According to this structure which requires no land 143, light absorption loss due to the lands 143, as well as the manufacturing cost, is reduced.

REFERENCE SIGNS LIST 1 lamp
10 housing 20 holder
30 power supply unit
40 casing
50 base
60 globe
70 reflection member
100, 2000, 3000, 4000, 5000 light-emitting module
101 light-emitting unit
110 substrate
120 LED (light-emitting element)
125 through hole
130 sealing member
140 wiring pattern
141, 142, 143 land
150 wire

The invention claimed is:

1. A light-emitting module, comprising:
a substrate; and
a plurality of elongated light-emitters that are arranged in rows on the substrate, wherein
each light-emitter includes an element array of a plurality of light-emitting diodes arranged on the substrate and a seal that seals the element array, the seal containing a wavelength converting material,
one light-emitter of the light-emitters that is nearer to the center of the substrate in a row direction is longer in a longitudinal direction of the one light-emitter than another light-emitter of the light-emitters that is nearer to an edge of the substrate in the row direction, the row direction being a direction along which the plurality of light-emitters are arranged in rows,
when the light-emitters are viewed from a direction that is parallel to a surface on which the plurality of light-emitters are arranged and that coincides with the row direction, two of the light-emitters are arranged such that both ends of one of the two light-emitters that is nearer to the center in the row direction are visible without being obstructed by the other light-emitter,
each of the visible ends contains at least one of the light-emitting diodes in the corresponding element array,
the plurality of light-emitting diodes are connected, by a wiring pattern formed on the substrate, to power feeding terminals mounted in a peripheral region of the substrate, and
a portion of the wiring pattern extends in one direction from a side of a light-emitter of the light-emitters, and extends between the light emitters in a second direction to the peripheral region of the substrate along the longitudinal direction of the light-emitters, the portion of the wiring pattern not making any other connections throughout its length,
the plurality of light-emitting diodes are divided into K groups, each group including N light-emitting diodes, where N and K are each an integer not less than 1,
the wiring pattern formed on the substrate connects the K groups in parallel and connects the N light-emitting diodes included in each group in series, such that all of the groups are connected in parallel to each other and none of the groups are connected serially to each other, and
for any two adjacent light-emitters of the light-emitters, the number of light-emitting diodes included in the element array longer in the longitudinal direction thereof is larger than the number of light-emitting diodes included in the element array shorter in the longitudinal direction thereof.

2. The light-emitting module of claim 1, wherein
an imaginary envelope line through edges of the plurality of light-emitters in a longitudinal direction thereof defines an arc.

3. The light-emitting module of claim 1, wherein
at least two pairs of adjacent light-emitters among the light-emitters are each arranged such that one of the adjacent light-emitters in the pair which is nearer to the center of the substrate has the visible ends which are visible without being obstructed by the other light-emitter in the pair, and
the visible ends of the light-emitter in the one of the two pairs which is nearer to the center of the substrate are shorter in length than the visible ends of the light-emitter in the other of the two pairs which is nearer to the edge of the substrate.

4. The light-emitting module of claim 1, wherein
in a plan view of the substrate, a center axis of the seal of each light-emitter in the longitudinal direction thereof matches an axis passing through centers of the light-emitting diodes included in the light-emitter.

5. The light-emitting module of claim 1, wherein
centers of the light-emitters in the longitudinal direction thereof are all aligned in the row direction.

6. The light-emitting module of claim 1, wherein
at least two adjacent light-emitters of the light-emitters are arranged such that, in the row direction, each light-emitting diode included in one of the two adjacent light-emitters is out of alignment with any light-emitting diode included in the other of the two adjacent light-emitters.

7. The light-emitting module of claim 1, wherein
both ends of the seal of each light-emitter in an array direction, along which the light-emitting diodes included therein are arranged, are in a rounded shape.

8. The light-emitting module of claim 1, wherein
the seal of each light-emitter contains a light-transmitting resin material.

9. A lighting source comprising:
a power supply; and
the light-emitting module of claim 1.

10. A lighting device comprising the lighting source of claim 9, wherein the power supply includes a circuit substrate.

11. A light-emitting module, comprising:
a substrate; and
a plurality of elongated light-emitters that are arranged in rows on the substrate, wherein
each light-emitter includes an element array of a plurality of light-emitting diodes arranged on the substrate and a seal that seals the element array, the seal containing a wavelength converting material,
one light-emitter of the light-emitters that is nearer to the center of the substrate in a row direction is longer in a longitudinal direction of the one light-emitter than another light-emitter of the light-emitters that is nearer to an edge of the substrate in the row direction, the row direction being a direction along which the plurality of light-emitters are arranged in rows,
when the light-emitters are viewed from a direction that is parallel to a surface on which the plurality of light-emitters are arranged and that coincides with the row direction, two of the light-emitters are arranged such that both ends of one of the two light-emitters that is nearer to the center in the row direction are visible without being obstructed by the other light-emitter, each of the visible ends contains at least one of the light-emitting diodes in the corresponding element array, and the light-emitters are divided into groups according to color of light emitted, each of the groups emitting a different color, the plurality of light-emitting diodes are connected, by a wiring pattern formed on the substrate, to power feeding terminals mounted in a peripheral region of the substrate, and a portion of the wiring pattern extends in one direction from a side of a light-emitter of the light-emitters, and extends between the light emitters in a second direction to the peripheral region of the substrate along the longitudinal direction of the light-emitters, the portion of the wiring pattern not making any other connections throughout its length, the plurality of light-emitting diodes are divided into K groups, each group including N light-emitting diodes, where N and K are each an integer not less than 1, the wiring pattern formed on the substrate connects the K groups in parallel and connects the N light-emitting diodes included in each group in series, such that all of the groups are connected in parallel to each other and none of the groups are connected serially to each other, and for any two adjacent light-emitters of the light-emitters, the number of light-emitting diodes included in the element array longer in the longitudinal direction thereof is larger than the number of light-emitting diodes included in the element array shorter in the longitudinal direction thereof.

12. The light-emitting module of claim 11, wherein the N light-emitting diodes included in each of the K groups are each spread across a plurality of the element arrays, and light-emitting diodes in the same one of the K groups and included in an element array of one light-emitter of the light-emitters all emit the same color of light as each other.

13. The light-emitting module of claim 11, wherein power is supplied to the light-emitters included in different groups from different power supplies.

14. The light-emitting module of claim 11, wherein the number of different colors is two.

15. The light-emitting module of claim 11, wherein the different colors are red, green, and blue.

16. A light-emitting module, comprising:

a substrate;

a plurality of elongated light-emitters that are arranged in rows on the substrate; and a reflector that is provided on the substrate, wherein each light-emitter includes an element array of a plurality of light-emitting diodes arranged on the substrate and a seal that seals the element array, the seal containing a wavelength converting material, one light-emitter of the light-emitters that is nearer to the center of the substrate in a row direction is longer in a longitudinal direction of the one light-emitter than another light-emitter of the light-emitters that is nearer to an edge of the substrate in the row direction, the row direction being a direction along which the plurality of light-emitters are arranged in rows, when the light-emitters are viewed from a direction that is parallel to a surface on which the plurality of light-emitters are arranged on and that coincides with the row direction, two of the light-emitters are arranged such that both ends of one of the two light-emitters that is nearer to the center in the row direction are visible without being obstructed by the other light-emitter, each of the visible ends contains at least one of the light-emitting diodes in the corresponding element array, and the reflector is arranged in front of, in the row direction, at least one of the visible ends, the reflector having a reflective surface that reflects light emitted from the at least one of the visible ends towards a primary emission direction of the light-emitters, the plurality of light-emitting diodes are connected, by a wiring pattern formed on the substrate, to power feeding terminals mounted in a peripheral region of the substrate, and a portion of the wiring pattern extends in one direction from a side of a light-emitter of the light-emitters, and extends between the light emitters in a second direction to the peripheral region of the substrate along the longitudinal direction of the light-emitters, the portion of the wiring pattern not making any other connections throughout its length the plurality of light-emitting diodes are divided into K groups, each group including N light-emitting diodes, where N and K are each an integer not less than 1, the wiring pattern formed on the substrate connects the K groups in parallel and connects the N light-emitting diodes included in each group in series, such that all of the groups are connected in parallel to each other and none of the groups are connected serially to each other, and for any two adjacent light-emitters of the light-emitters, the number of light-emitting diodes included in any element array longer in the longitudinal direction thereof is larger than the number of light-emitting diodes included in any element array shorter in the longitudinal direction thereof.

17. A light-emitting module, comprising:

a substrate; and a plurality of elongated light-emitters that are arranged in rows on the substrate, wherein each light-emitter includes an element array of a plurality of light-emitting diodes arranged on the substrate, the substrate has steps on which the light-emitters are arranged, height of the steps increasing in a direction along which the plurality of light-emitters are arranged in rows from a periphery of the substrate to a central area of the substrate, the plurality of light-emitting diodes are connected, by a wiring pattern formed on the substrate, to power feeding terminals mounted in a peripheral region of the substrate, and a portion of the wiring pattern extends in one direction from a side of a light-emitter of the light-emitters, and extends between the light emitters in a second direction to the peripheral region of the substrate along the longitudinal direction of the light-emitters, the portion of the wiring pattern not making any other connections throughout its length, the plurality of light-emitting diodes are divided into K groups, each group including N light-emitting diodes, where N and K are each an integer not less than 1, the wiring pattern formed on the substrate connects the K groups in parallel and connects the N light-emitting diodes included in each group in series, such that all of the groups are connected in parallel to each other and none of the groups are connected serially to each other, and for any two adjacent light-emitters of the light-emitters, the number of light-emitting diodes included in any element array longer in the longitudinal direction thereof is larger than the number of light-emitting diodes included in any element array shorter in the longitudinal direction thereof.

18. The light-emitting module of claim 17, wherein
a difference in height of adjacent ones of the steps is less than a thickness of a seal that seals the light-emitters.

19. The light-emitting module of claim 17, wherein
the steps have arrangement surfaces on which the light-emitters are arranged and connecting surfaces that connect adjacent ones of the arrangement surfaces,
the connecting surfaces are inclined with respect to the arrangement surfaces, and reflect light from the light-emitters towards a primary emission direction of the light-emitters.

\* \* \* \* \*